(12) United States Patent
Osaka et al.

(10) Patent No.: US 7,547,912 B2
(45) Date of Patent: Jun. 16, 2009

(54) PHOTOELECTRIC CONVERSION LAYER, PHOTOELECTRIC CONVERSION DEVICE AND IMAGING DEVICE, AND METHOD FOR APPLYING ELECTRIC FIELD THERETO

(75) Inventors: Itaru Osaka, Kanagawa (JP); Masayuki Hayashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 490 days.

(21) Appl. No.: 11/508,276

(22) Filed: Aug. 23, 2006

(65) Prior Publication Data

US 2007/0044829 A1  Mar. 1, 2007

(51) Int. Cl.
*H01L 35/24* (2006.01)
*H01L 51/00* (2006.01)
*H01L 31/062* (2006.01)
*H01L 31/113* (2006.01)

(52) U.S. Cl. .......................... 257/40; 257/292; 257/440
(58) Field of Classification Search .................. 257/40, 257/290–294, 440, E27, E51, E27.117
See application file for complete search history.

(56) References Cited

U.S. PATENT DOCUMENTS

| | | | | |
|---|---|---|---|---|
| 7,271,291 B2* | 9/2007 | Inada et al. | ................... | 257/40 |
| 7,473,923 B2* | 1/2009 | Tsutsui et al. | ................ | 257/40 |
| 2006/0054987 A1* | 3/2006 | Nii | .............................. | 257/291 |
| 2006/0071253 A1* | 4/2006 | Nii | .............................. | 257/291 |
| 2006/0273362 A1* | 12/2006 | Osaka et al. | ................. | 257/292 |
| 2008/0142790 A1* | 6/2008 | Kitamura et al. | ............... | 257/40 |
| 2008/0315185 A1* | 12/2008 | Araki | ........................... | 257/40 |
| 2009/0032807 A1* | 2/2009 | Shinohara et al. | ............. | 257/40 |

FOREIGN PATENT DOCUMENTS

| | | |
|---|---|---|
| JP | 2003-158254 A | 5/2003 |
| JP | 2003-234460 A | 8/2003 |
| JP | 2003-332551 A | 11/2003 |

* cited by examiner

*Primary Examiner*—Cuong Q Nguyen
(74) *Attorney, Agent, or Firm*—Sughrue Mion, PLLC

(57) ABSTRACT

A photoelectric conversion layer comprising a compound represented by the following formula (1):

$$L{-}(A)_n \qquad \text{Formula (1)}$$

wherein L represents a divalent or polyvalent connecting group; n represents an integer of 2 or more; and A is a chemical structure represented by the following formula (2):

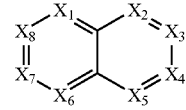

Formula (2)

wherein $X_1$ to $X_8$ each independently represents a substituted or unsubstituted carbon atom or a nitrogen atom.

31 Claims, 2 Drawing Sheets

PHOTOELECTRIC CONVERSION LAYER, PHOTOELECTRIC CONVERSION DEVICE AND IMAGING DEVICE, AND METHOD FOR APPLYING ELECTRIC FIELD THERETO

FIELD OF THE INVENTION

The present invention relates to a photoelectric conversion layer, a photoelectric conversion device having the photoelectric conversion layer and a solid imaging device, and to a method for applying an electric field thereto and an applied device.

BACKGROUND OF THE INVENTION

A photoelectric conversion layer is widely utilized in, for example, optical sensors and in particular, is suitably used as a solid imaging device (light receiving device) of imaging device (solid imaging device) such as a televison camera. As materials of the photoelectric conversion layer which is used as the solid imaging device of imaging device, layers made of an inorganic material such as Si layers and a-Se layers are mainly used.

Conventional photoelectric conversion layers using such an inorganic material layer do not have sharp wavelength dependency against photoelectric conversion layer characteristics. For that reason, as to an imaging device using a photoelectric conversion layer, imaging devices of a three-plate structure in which a prism capable of resolving incident light into three red, green and blue primary colors and three sheets of photoelectric conversion layer to be disposed behind the prism are the main current.

However, imaging devices of such a three-plate type structure inevitably become large in both the dimension and the weight from the standpoint of structure.

In order to realize miniaturization and weight reduction of the imaging device, a device which is not required to provide a spectral prism and which is of a single-plate structure made of one sheet of a light receiving device is desired. For example, imaging devices of a structure in which red, green and blue filters are disposed in a single-plate light receiving device are studied. Also, it is studied to use, as a material of the photoelectric conversion layer, an organic material having such advantages that the kind and characteristic are diverse and that a degree of freedom in the processing shape is large. A photoelectric conversion layer having enhanced photosensitivity (sensitivity) and a light receiving device using the same are described in JP-A-2003-158254. According to JP-A-2003-158254, organic materials are used as a p-type semiconductor and an n-type semiconductor. However, in the working examples of JP-A-2003-158254, there is described only an example in which polymethylphenylsilane (PMPS) is used as a p-type organic material, an 8-hydroxyquinoline-aluminum complex (Alq3) is used as an n-type organic material, and coumarin 6 as an organic dye is added in an amount of 5.0 parts by weight based on 100 parts by weight of the foregoing PMPS. Furthermore, in the section regarding preferred embodiments in JP-A-2003-158254, it is merely described that the organic dye is preferably used in an amount of from 0.1 to 50 parts by weight based on 100 parts by weight of the p-type or n-type organic material which constitutes the photoelectric conversion layer. However, this JP-A-2003-158254 does not describe that the organic dye is used as the p-type or n-type organic material.

Also, for the purpose of realizing miniaturization and weight reduction of the imaging device, JP-A-2003-234460 describes a stack type photoelectric conversion layer with a low resolution is described as a device which is not required to provide a spectral prism and which is of a single-plate structure made of one sheet of light receiving device. JP-A-2003-234460 describes that, for example, a preferred stack type photoelectric conversion layer is prepared by stacking a photoelectric conversion layer having a function to absorb light of a wavelength of any one color of three primary colors of light, a photoelectric conversion layer having a function to absorb light of a wavelength of one of other colors and a photoelectric conversion layer having a function to absorb the remaining color and that in this way, a color image having high sensitivity and resolution can be obtained.

Furthermore, JP-A-2003-332551 describes a stack type photoelectric conversion layer similar to the foregoing JP-A-2003-234460. However, JP-A-2003-158254, JP-A-2003-234460 and JP-A-2003-332551 do not describe that the dye according to the invention gives a preferred performance.

SUMMARY OF THE INVENTION

An object of the invention is to provide a photoelectric conversion layer, a photoelectric conversion device and an imaging device (preferably a color image sensor) each having high photoelectric conversion efficiency and S/N ratio.

The problems of the invention can be solved by the following dissolution means.

(1) A photoelectric conversion layer comprising at least one compound represented by the following formula (1).

$$L\text{---}(A)_n \qquad \text{Formula (1)}$$

In the formula (1), L represents a divalent or polyvalent connecting group (di- or more valent connecting group); n represents an integer of 2 or more; and A represents a chemical structure represented by the following formula (2).

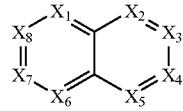

Formula (2)

In the formula (2), $X_1$ to $X_8$ each represents a substituted or unsubstituted carbon atom or a nitrogen atom.

(2) The photoelectric conversion layer as set forth in (1), wherein the photoelectric conversion layer contains a p-type semiconductor layer and an n-type semiconductor layer and a compound represented by the formula (1) as set forth in (1).

(3) The photoelectric conversion layer as set forth (1), wherein the photoelectric conversion layer has a p-type semiconductor layer and an n-type semiconductor layer, and at least one of the p-type semiconductor layer and the n-type semiconductor layer contains a compound represented by the formula (1) as set forth in (1).

(4) The photoelectric conversion layer as set forth in (2) or (3), wherein a bulk heterojunction structure layer containing a p-type semiconductor and an n-type semiconductor is provided as an interlayer between the p-type semiconductor layer and the n-type semiconductor layer.

(5) The photoelectric conversion layer as set forth in (2) or (3), which has a structure having the number of a repeating structure of a pn junction layer formed of the p-type semiconductor layer and the n-type semiconductor layer of 2 or more.

(6) The photoelectric conversion layer as set forth in any one of (2) to (5), wherein all of the p-type semiconductor and the n-type semiconductor are an organic semiconductor.

(7) The photoelectric conversion layer as set forth in any one of (1) to (6), wherein the photoelectric conversion layer has a thickness of 30 nm or more and not more than 300 nm.

(8) The photoelectric conversion layer as set forth in any one of (2) to (7), wherein the p-type semiconductor or the n-type semiconductor in the incident light side is colorless.

(9) A photoelectric conversion device comprising the photoelectric conversion layer as set forth in any one of (1) to (8).

(10) A photoelectric conversion device comprising the photoelectric conversion layer as set forth in any one of (1) to (8) between one pair of electrodes.

(11) A photoelectric conversion device comprising the photoelectric conversion layer as set forth in any one of (1) to (8), wherein two or more of the photoelectric conversion layers are stacked.

(12) The photoelectric conversion device as set forth in (11), wherein the two or more layers are three layers of a blue photoelectric conversion layer, a green photoelectric conversion layer and a red photoelectric conversion layer.

(13) The photoelectric conversion device as set forth in (12), wherein when spectral absorption maximum values of the blue photoelectric conversion layer, the green photoelectric conversion layer and the red photoelectric conversion layer are designated as λmax1, λmax2 and λmax3, respectively, the λmax1 is in the range of 400 nm or more and not more than 500 nm, the λmax2 is in the range of 500 nm or more and not more than 600 nm, and the λmax3 is in the range of 600 nm or more and not more than 700 nm.

(14) The photoelectric conversion device as set forth in (12) or (13), wherein when spectral sensitivity maximum values of the blue photoelectric conversion layer, the green photoelectric conversion layer and the red photoelectric conversion layer are designated as Smax1, Smax2 and Smax3, respectively, the Smax1 is in the range of 400 nm or more and not more than 500 nm, the Smax2 is in the range of 500 nm or more and not more than 600 nm, and the Smax3 is in the range of 600 nm or more and not more than 700 nm.

(15) The photoelectric conversion device as set forth in any one of (12) to (14), wherein a gap between a shortest wavelength and a longest wavelength exhibiting 50% of the spectral maximum absorption of each of the blue photoelectric conversion layer, the green photoelectric conversion layer and the red photoelectric conversion layer is not more than 120 nm.

(16) The photoelectric conversion device as set forth in any one of (12) to (15), wherein a gap between a shortest wavelength and a longest wavelength exhibiting 50% of the spectral maximum sensitivity of each of the blue photoelectric conversion layer, the green photoelectric conversion layer and the red photoelectric conversion layer is not more than 120 mn.

(17) The photoelectric conversion device as set forth in any one of (12) to (16), wherein a gap between a shortest wavelength and a longest wavelength exhibiting 80% of the spectral maximum absorption of each of the blue photoelectric conversion layer, the green photoelectric conversion layer and the red photoelectric conversion layer is 20 run or more and not more than 100 nm.

(18) The photoelectric conversion device as set forth in any one of (12) to (17), wherein a gap between a shortest wavelength and a longest wavelength exhibiting 80% of the spectral maximum sensitivity of each of the blue photoelectric conversion layer, the green photoelectric conversion layer and the red photoelectric conversion layer is 20 nm or more and not more than 100 nm.

(19) The photoelectric conversion device as set forth in any one of (12) to (18), wherein a gap between a shortest wavelength and a longest wavelength exhibiting 20% of the spectral maximum absorption of each of the blue photoelectric conversion layer, the green photoelectric conversion layer and the red photoelectric conversion layer is not more than 180 nm.

(20) The photoelectric conversion device as set forth in any one of (12) to (19), wherein a gap between a shortest wavelength and a longest wavelength exhibiting 20% of the spectral maximum sensitivity of each of the blue photoelectric conversion layer, the green photoelectric conversion layer and the red photoelectric conversion layer is not more than 180 nm.

(21) The photoelectric conversion device as set forth in any one of (12) to (20), wherein a longest wavelength exhibiting 50% of the spectral maximum absorption of the blue photoelectric conversion layer, the green photoelectric conversion layer and the red photoelectric conversion layer is from 460 nm to 510 nm, from 560 nm to 610 nm and from 640 nm to 730 nm, respectively.

(22) The photoelectric conversion device as set forth in any one of (12) to (21), wherein a longest wavelength exhibiting 50% of the spectral maximum sensitivity of the blue photoelectric conversion layer, the green photoelectric conversion layer and the red photoelectric conversion layer is from 460 nm to 510 nm, from 560 nm to 610 nm and from 640 nm to 730 nm, respectively.

(23) A photoelectric conversion device having at least two electromagnetic wave absorption/photoelectric conversion sites, at least one of these sites comprising the photoelectric conversion layer as set forth in any one of (1) to (8).

(24) The photoelectric conversion device as set forth in (23), wherein at least two electromagnetic wave absorption/photoelectric conversion sites have a stack type structure of at least two layers.

(25) The photoelectric conversion device as set forth in (24), wherein an upper layer thereof comprises a site capable of absorbing green light and undergoing photoelectric conversion.

(26) A photoelectric conversion device having at least three electromagnetic wave absorption/photoelectric conversion sites, at least one of these sites comprising the photoelectric conversion layer as set forth in any one of (1) to (8).

(27) The photoelectric conversion device as set forth in (26), wherein an upper layer thereof comprises a site capable of absorbing green light and undergoing photoelectric conversion.

(28) The photoelectric conversion device as set forth in (26) or (27), wherein at least two electromagnetic wave absorption/photoelectric conversion sites comprise an inorganic layer.

(29) The photoelectric conversion device as set forth in (28), wherein at least two electromagnetic wave absorption/photoelectric conversion sites are formed within a silicon substrate.

(30) An imaging device comprising the photoelectric conversion device as set forth in any one of (9) to (29).

(31) A method for applying an electric field of $10^{-2}$ V/cm or more and not more than $1 \times 10^{10}$ V/cm to the photoelectric conversion layer as set forth in any one of (1) to (8), the photoelectric conversion device as set forth in any one of (9) to (29), or the imaging device as set forth in (30).

(32) A photoelectric conversion layer as applied by the method as set forth in (31).
(33) A photoelectric conversion device as applied by the method as set forth in (31).
(34) An imaging device as applied by the method as set forth in (31).

The photoelectric conversion layer, the photoelectric conversion device and the imaging device according to the invention have advantages such as high photoelectric conversion efficiency and excellent durability. In two-layer stack type and BGR three-layer stack type solid imaging devices, there are the following characteristic features in addition to the foregoing advantages.

Because of a stacked structure, a moire pattern is not generated, resolution is high because an optical low pass filter is not required, and color blur is not formed. Furthermore, a signal treatment is simple, and a pseudo signal is not generated. In addition, in the case of CMOS, mixing of pixels is easy, and partial reading is easy.

Since an aperture is 100% and a micro lens is not required, there is no limitation in an exit pupil distance against camera lens, and there is no shading. Accordingly, the invention is suitable for lens interchangeable cameras. On this occasion, it becomes possible to make the lens thin.

Since a micro lens is not required, it becomes possible to seal a glass by filling with an adhesive. Thus, it is possible to make a package thin and increase the yield, resulting in a reduction of costs.

Since an organic dye is used, high sensitivity is obtained, an IR filter is not required, and a flare is lowered.

DESCRIPTION OF REFERENCE NUMERALS AND SIGNS

Figure 1:
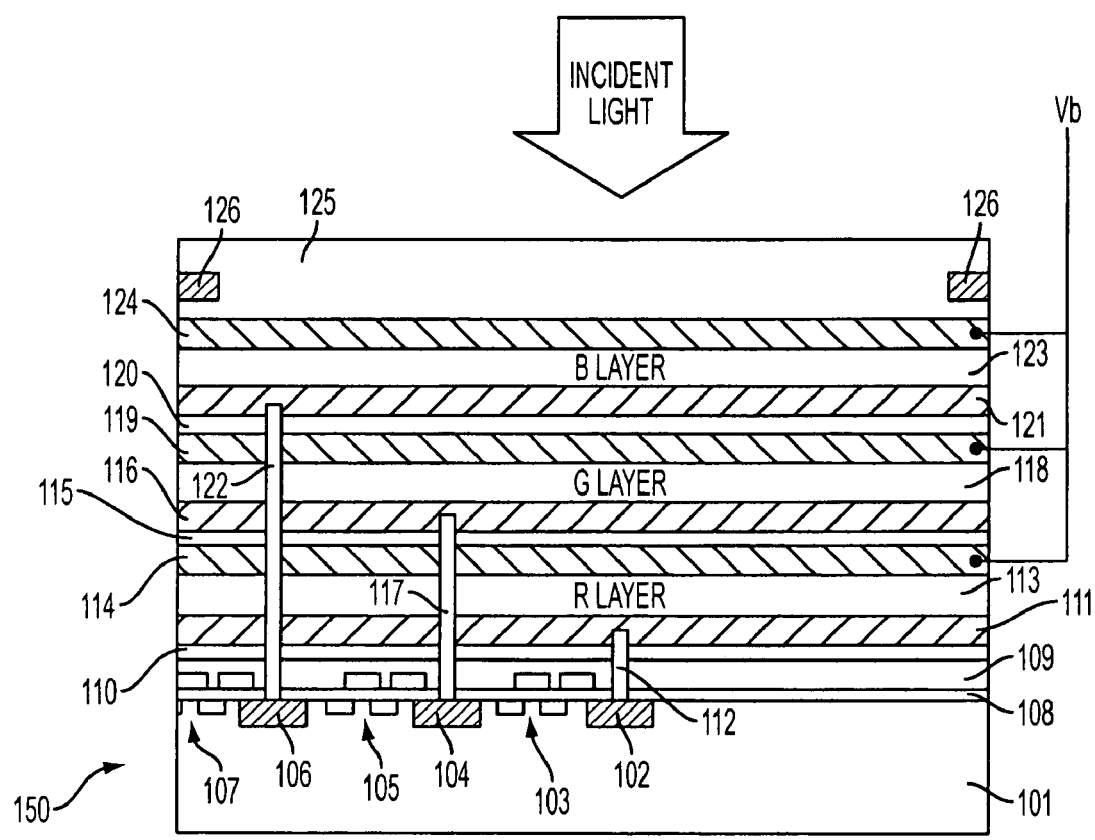
FIG. 1 is a cross-sectional schematic view of a preferred imaging device according to the invention.

1: Antireflection layer
2: Infrared light-cut dielectric multiple layer
3, 4, 5: Protective layer
6: Transparent counter electrode
7: Electron blocking layer
8: p layer
9: n layer
10: Hole blocking layer
11, 12: Layer containing metal wiring
13: Silicon mono-crystal substrate
14: Transparent pixel electrode
15: Plug
16: Pad
17: Light shielding layer
18: Connection electrode
19: Metal wiring
20: Counter electrode pad
21: n layer
22: p layer
23: n layer
24: p layer
25: n layer
26: Transistor
27: Read-out pad
101: P well layer
102, 104, 106: High-concentration impurity region
103, 105, 107: MOS circuit
108: Gate insulating layer
109, 110: Insulating layer
111, 114, 116, 119, 121, 124: Transparent electrode layer
112, 117, 122: Electrode
113, 118, 123: Photoelectric conversion layer
110, 115, 120, 125: Transparent insulating layer
126: Light shielding layer
150: Semiconductor substrate

DETAILED DESCRIPTION OF THE INVENTION

In the invention, the following compounds can be used as the compound represented by the formula (1). Though these compounds may be used as any one of an organic p-type semiconductor or an organic n-type semiconductor, or a hole blocking material which is stacked between such organic semiconductors and electrodes, they are preferably used as an organic n-type semiconductor or a hole blocking material.

Next, the compound represented by the formula (1) according to the invention will be described in detail.

In the invention, in the case where a specific portion is called "group", it is meant that even when the subject portion may be not substituted by itself, it may be substituted with one or more kinds (to the highest possible number) of substituents. For example, the term "alkyl group" means a substituted or unsubstituted alkyl group. Furthermore, any substituent may be used as the substituent which can be used in the compound according to the invention.

When such a substituent is designated as "W", any substituent may be used as the substituent represented by W without particular limitations. Examples thereof include a halogen atom, an alkyl group (inclusive of a cycloalkyl group, a bicycloalkyl group, and a tricycloalkyl group), an alkenyl group (inclusive of a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (inclusive of an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B$(OH)_2$), a phosphato group (—OPO$(OH)_2$), a sulfato group (—OSO$_3$H), and other known substituents.

In more detail, W represents a halogen atom (for example, a fluorine atom, a chlorine atom, a bromine atom, and an iodine atom), an alkyl group [which represents a linear, branched or cyclic substituted or unsubstituted alkyl group; examples of which include an alkyl group (preferably an alkyl group having from 1 to 30 carbon atoms, for example, methyl, ethyl, n-propyl, isopropyl, t-butyl, n-octyl, eicosyl, 2-chloroethyl, 2-cyanoethyl, and 2-ethylhexyl), a cycloalkyl group (preferably a substituted or unsubstituted cycloalkyl group having from 3 to 30 carbon atorns, for example, cyclohexyl, cyclopentyl, and 4-n-dodecylcyclohexyl), a bicycloalkyl group (preferably a substituted or unsubstituted bicycloalkyl group having from 5 to 30 carbon atoms, namely a monovalent group resulting from eliminating one hydrogen atom from a bicycloalkane having from 5 to 30 carbon atoms, for example, bicyclo[1,2,2]heptan-2-yl and bicyclo[2,2,2]octan-3-yl), and a tricyclic structure containing more cyclic structures; and though the term "alkyl group" in the substituents as described hereunder (for example, an alkyl group of an alkylthio group) represents an alkyl group having such concept, it also includes an alkenyl group and an alkynyl group], an alkenyl group [which represents a linear, branched or cyclic substituted or unsubstituted alkenyl group; and examples of which include an alkenyl group (preferably a substituted or unsubstituted alkenyl group having from 2 to 30 carbon atoms, for example, vinyl, allyl, prenyl, geranyl, and oleyl), a cycloalkenyl group (preferably a substituted or unsubstituted cycloalkenyl group having from 3 to 30 carbon atoms, namely a monovalent group resulting from eliminating one hydrogen atom from a cycloalkene having from 3 to 30 carbon atoms, for example, 2-cyclopenten-1-yl and 2-cyclohexen-1-yl), and a bicycloalkenyl group (a substituted or unsubstituted bicycloalkenyl group, and preferably a substituted or unsubstituted bicycloalkenyl group having from 5 to 30 carbon atoms, namely a monovalent group resulting from eliminating one hydrogen atom from a bicycloalkene containing one double bond, for example, bicyclo[2,2,1]hept-2-en-1-yl and bicyclo[2,2,2]oct-2-en-4-yl)], an alkynyl group (preferably a substituted or unsubstituted alkynyl group having from 2 to 30 carbon atoms, for example, ethynyl, propargyl, and trimethylsilylethynyl), an aryl group (preferably a substituted or unsubstituted aryl group having from 6 to 30 carbon atoms, for example, phenyl, p-tolyl, naphthyl, m-chlorophenyl, and o-hexadecanoylaminophenyl), a heterocyclic group (preferably a monovalent group resulting from eliminating one hydrogen atom from a 5- or 6-membered substituted or unsubstituted aromatic or non-aromatic heterocyclic compound, and more preferably a 5- or 6-membered aromatic heterocyclic group having from 3 to 30 carbon atoms, for example, 2-furyl, 2-thienyl, 2-pyrimidinyl, and 2-benzothiazolyl; and incidentally, a cationic heterocyclic group such as 1-methyl-2-pyridinio and 1-methyl-2-quinolinio may also be employed), a cyano group, a hydroxyl group, a nitro group, a carboxyl group, an alkoxy group (preferably a substituted or unsubstituted alkoxy group having from 1 to 30 carbon atoms, for example, methoxy, ethoxy, isopropoxy, t-butoxy, n-octyloxy, and 2-methoxyethoxy), an aryloxy group (preferably a substituted or unsubstituted aryloxy group having from 6 to 30 carbon atoms, for example, phenoxy, 2-methylphenoxy, 4-t-butylphenoxy, 3-nitrophenoxy, and 2-tetradecanoylaminophenoxy), a silyloxy group (preferably a silyloxy group having from 3 to 20 carbon atoms, for example, trimethylsilyloxy and t-butyldimethylsilyloxy), a heterocyclic oxy group (preferably a substituted or unsubstituted heterocyclic oxy group having from 2 to 30 carbon atoms, for example, 1-phenyltetrazol-5-oxy and 2-tetrahydropyranyloxy), an acyloxy group (preferably a formyloxy group, a substituted or unsubstituted alkylcarbonyloxy group having from 2 to 30 carbon atoms, and a substituted or unsubstituted arylcarbonyloxy group having from 6 to 30 carbon atoms, for example, formyloxy, acetyloxy, pivaloyloxy, stearoyloxy, benzoyloxy, and p-methoxyphenylcarbonyloxy), a carbarnoyloxy group (preferably a substituted or unsubstituted carbamoyloxy group having from 1 to 30 carbon atoms, for example, N,N-dimethylcarbamoyloxy, N,N-diethylcarbamoyloxy, morpholinocarbonyloxy, N,N-di-n-octylaminocarbonyloxy, and N-n-octylcarbamoyloxy), an alkoxycarbonyloxy group (preferably a substituted or unsubstituted alkoxycarbonyloxy group having from 2 to 30 carbon atoms, for example, methoxycarbonyloxy, ethoxycarbonyloxy, t-butoxycarbonyloxy, and n-octylcarbonyloxy), an aryloxycarbonyloxy group (preferably a substituted or unsubstituted aryloxycarbonyloxy group having from 7 to 30 carbon atoms, for example, phenoxycarbonyloxy, pmethoxyphenoxycarbonyloxy, and p-n-hexadecyloxyphenoxycarbonyloxy), an amino group (preferably an amino group, a substituted or unsubstituted alkylamino group having from 1 to 30 carbon atoms, and a substituted or unsubstituted anilino group having from 6 to 30 carbon atoms, for example, amino, methylamino, dimethylamino, anilino, N-methyl-anilino, and diphenylamino), an ammonio group (preferably an ammonio group and an ammonio group which is substituted with a substituted or unsubstituted alkyl group, an aryl group or a heterocyclic group each having from 1 to 30 carbon atoms, for example, trimethylammonio, triethylammonio, and diphenylmethylammonio), an acylamino group (preferably a formylamino group, a substituted or unsubstituted alkylcarbonylamino group having from 1 to 30 carbon atoms, and a substituted or unsubstituted arylcarbonylamino group having from 6 to 30 carbon atoms, for example, formylamino, acetylamino, pivaroylamino, lauroylamino, benzoylamino, and 3,4,5-tri-n-octyloxyphenylcarbonylamino), an aminocarbonylamino group (preferably a substituted or unsubstituted aminocarbonylamino group having from 1 to 30 carbon atoms, for example, carbamoylamino, N,N-dimethylaminocarbonylamino, N,N-diethylaminocarbonylamino, and morpholinocarbonylamino), an alkoxycarbonylamino group (preferably a substituted or unsubstituted alkoxycarbonylamino group having from 2 to 30 carbon atoms, for example, methoxycarbonylamino, ethoxycarbonylamino, t-butoxycarbonylamino, n-octadecyloxycarbonylamino, and N-methyl-methoxycarbonylamino), an aryloxycarbonylamino group (preferably a substituted or unsubstituted aryloxycarbonylamino group having from 7 to 30 carbon atoms, for example, phenoxycarbonylamino, p-chlorophenoxycarbonylamino, and m-n-octyloxyphenoxycarbonylamino), a sulfamoylamino group (preferably a substituted or unsubstituted sulfamoylamino group having from 0 to 30 carbon atoms, for example, sulfamoylamino, N,N-dimethylaminosulfonylamino, and N-n-octylaminosulfonylamino), an alkyl- or arylsulfonylamino group (preferably a substituted or unsubstituted alkylsulfonylamino group having from 1 to 30 carbon atoms and a substituted or unsubstituted arylsulfonylamino group having from 6 to 30 carbon atoms, for example, methylsulfonylamino, butylsulfonylamino, phenylsulfonylamino, 2,3,5-trichlorophenylsulfonylamino, and p-methylphenylsulfonylamino), a mercapto group, an alkylthio group (preferably a substituted or unsubstituted alkylthio group having from 1 to 30 carbon atoms, for example, methylthio, ethylthio, and n-hexadecylthio), an arylthio group (preferably a substituted or unsubstituted arylthio group having from 6 to 30 carbon atoms, for example, phenylthio, p-cblorophenylthio, and m-methoxyphenylthio), a heterocyclic thio group (preferably a substituted or unsubstituted heterocyclic thio group having from 2 to 30 carbon atoms, for example, 2-benzothiazoylthio and 1-phenyltetrazol-5-ylthio), a sulfamoyl group (preferably a substituted or unsubstituted sulfamoyl group having from 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, and N-(N'-phenylcarbamoyl)sulfamoyl), a sulfo group, an alkyl- or arylsulfinyl group (preferably a substituted or unsubstituted alkylsulfinyl group having from 1 to 30 carbon atoms and a substituted or unsubstituted arylsulfmyl group having from 6 to 30 carbon atoms, for example, methylsulfinyl, ethylsulfinyl, phenylsulfinyl, and p-methylphenylsulfinyl), an alkyl- or arylsulfonyl group (preferably a substituted or unsubstituted alkylsulfonyl group having from 1 to 30 carbon atoms and a substituted or unsubstituted arylsulfonyl group having from 6 to 30 carbon atoms, for example, methylsulfonyl, ethylsulfonyl, phenylsulfonyl, and p-methylphenylsulfonyl), an acyl group (preferably a formyl group, a substituted or unsubstituted alkylcarbonyl group having from 2 to 30 carbon atoms, a substituted or unsubstituted arylcarbonyl group having from 7 to 30 carbon atoms, and a substituted or unsubstituted heterocyclic carbonyl group having from 4 to 30 carbon atoms where the carbon atom of the heterocyclic group is connected to the carbonyl group, for example, acetyl, pivaloyl, 2-chloroacetyl, stearoyl, benzoyl, p-n-octyloxyphenylcarbonyl, 2-pyridylcarbonyl, and 2-furfurylcarbonyl), an aryloxycarbonyl group (preferably a substituted or unsubstituted aryloxycarbonyl group having from 7 to 30 carbon atoms, for example, phenoxycarbonyl, o-chlorophenoxycarbonyl, m-nitrophenoxycarbonyl, and p-t-butylphenoxycarbonyl), an alkoxycarbonyl group (preferably a substituted or unsubstituted alkoxycarbonyl group having from 2 to 30 carbon atoms, for example, methoxycarbonyl, ethoxycarbonyl, t-butoxycarbonyl, and n-octadecyloxycarbonyl), a carbamoyl group (preferably a substituted or unsubstituted carbamoyl group having from 1 to 30 carbon atoms, for example, carbamoyl, N-methylcarbamoyl, N,N-dimethylcarbamoyl, N,N-di-n-octylcarbamoyl, and N-(methylsulfonyl)carbamoyl), an aryl or heterocyclic azo group (preferably a substituted or unsubstituted aryl azo group having from 6 to 30 carbon atoms and a substituted or unsubstituted heterocyclic azo group having from 3 to 30 carbon atoms, for example, phenylazo, p-chlorophenylazo, and 5-ethylthio-1,3,4-thiadiazol-2-ylazo), an imide group (preferably N-succimide and N-phthalimide), a phosphino group (preferably a substituted or unsubstituted phosphino group having from 2 to 30 carbon atoms, for example, dimethylphosphino, diphenylphosphino, and methylphenoxyphosphino), a phosphinyl group (preferably a substituted or unsubstituted phosphinyl group having from 2 to 30 carbon atoms, for example, phosphinyl, dioctyloxyphosphinyl, and diethoxyphosphinyl), a phosphinyloxy group (preferably a substituted or unsubstituted phosphinyloxy group having from 2 to 30 carbon atoms, for example, diphenyloxyphosphinyloxy and dioctyloxyphosphinyloxy), a phosphinylamino group (preferably a substituted or unsubstituted phosphinylamino group having from 2 to 30 carbon atoms, for example, dimethoxyphosphinylamino and dimethylaminophosphinylamino), a phospho group, a silyl group (preferably a substituted or unsubstituted silyl group having from 3 to 30 carbon atoms, for example, trimethylsilyl, t-butyldimethylsilyl, and phenyldimetbylsilyl), a hydrazino group (preferably a substituted or unsubstituted hydrazino group having from 0 to 30 carbon atoms, for example, trimethylhydrazino), or a ureido group (preferably a substituted or unsubstituted ureido group, for example, N,N-dimethylureido).

Furthermore, two Ws can also be taken together to form a ring (an aromatic or non-aromatic hydrocarbon ring or a heterocyclic ring; and these rings can be further combined with each other to form a polycyclic fused ring, for example, a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophenc ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathine ring, a phenothiazine ring, and a phenazine ring).

With respect to the substituent W, ones containing a hydrogen atom may be converted by eliminating the hydrogen atom and further substituting with the foregoing group. Examples of such substituents include a —CONHSO$_2$— group (a sulfonylcarbonyl group or a carbonylsulfamoyl group), a —CONHCO— group (a carbonylcarbamoyl group), and an —SO$_2$NHSO$_2$— group (a sulfonylsulfamoyl group).

More specifically, there are enumerated an alkylcarbonylaminosulfonyl group (for example, acetylaminosulfonyl), an arylcarbonylaminosulfonyl group (for example, benzoylaminosulfonyl), an alkylsulfonylaminocarbonyl group (for example, methylsulfonylaminocarbonyl), and an arylsulfonylaminocarbonyl group (for example, p-methylphenylsulfonylaminocarbonyl).

In the formula (1), L represents a divalent or polyvalent connecting group. The connecting group represented by L is preferably a connecting group formed by C, N, O, S, Si, or Ge; more preferably a connecting group composed of an aromatic ring or an aromatic heterocyclic ring; and especially preferably a connecting group composed of a benzene ring, a pyridine ring, a pyrimidine ring, or a triazine ring.

The connecting group represented by L may have a substituent. As the substituent, the substituents represented by the substituent W can be employed.

Specific examples of the connecting group represented by L will be given below, but it should not be construed that the invention is limited thereto. It is only required that in the following connecting groups, a nitrogen-containing heterocyclic ring as derived from the foregoing formula (1) is bound to any two or more of free bonds and that a hydrogen atom or a substituent such as the substituent W is bound to a bond to which the nitrogen-containing heterocyclic ring is not bound.

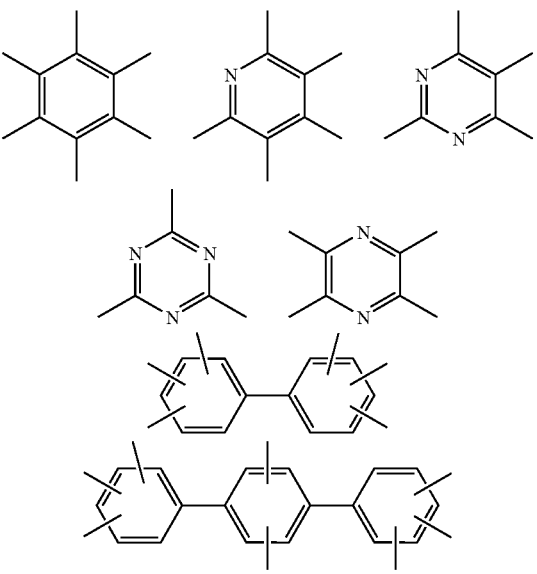

-continued
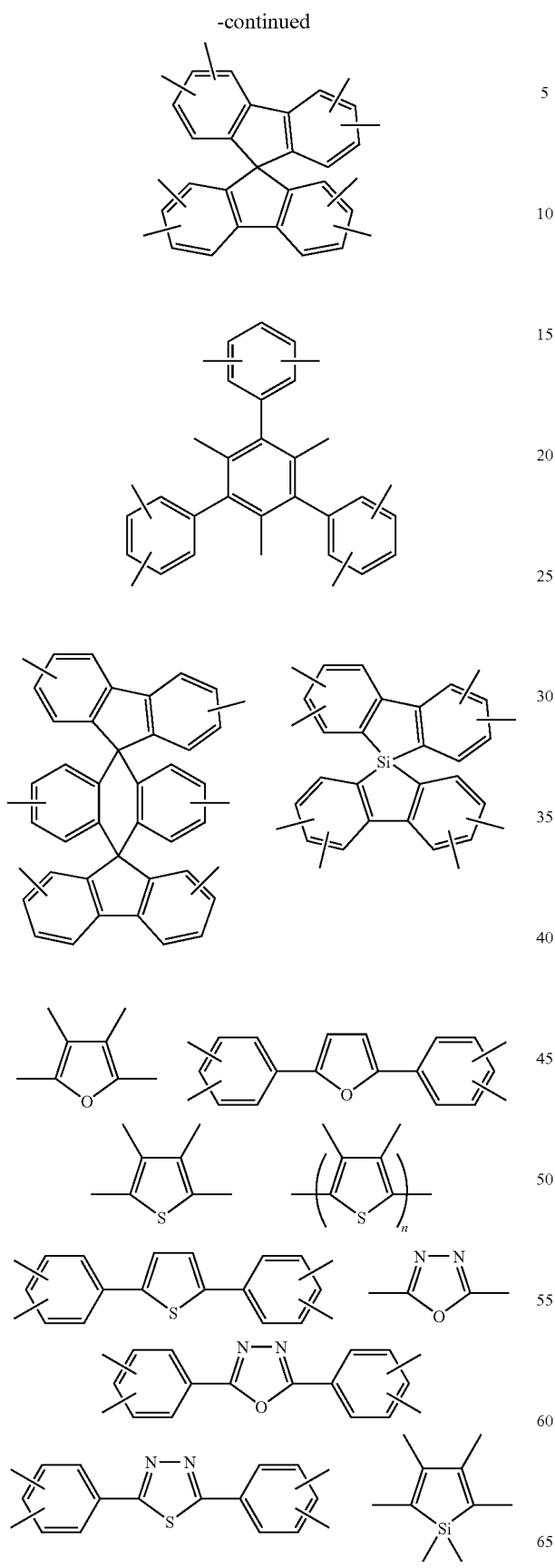
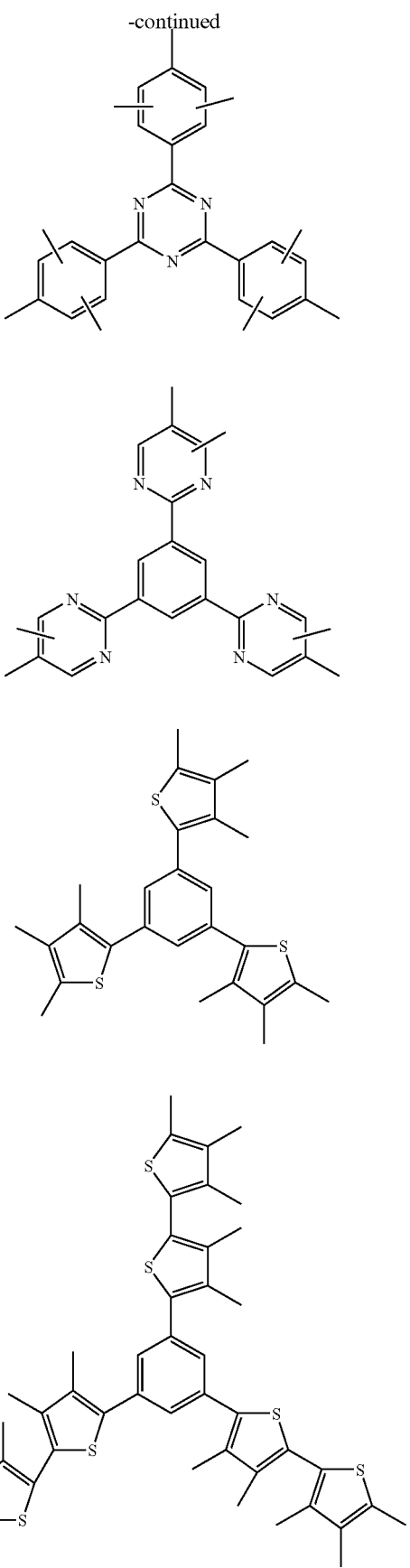

-continued

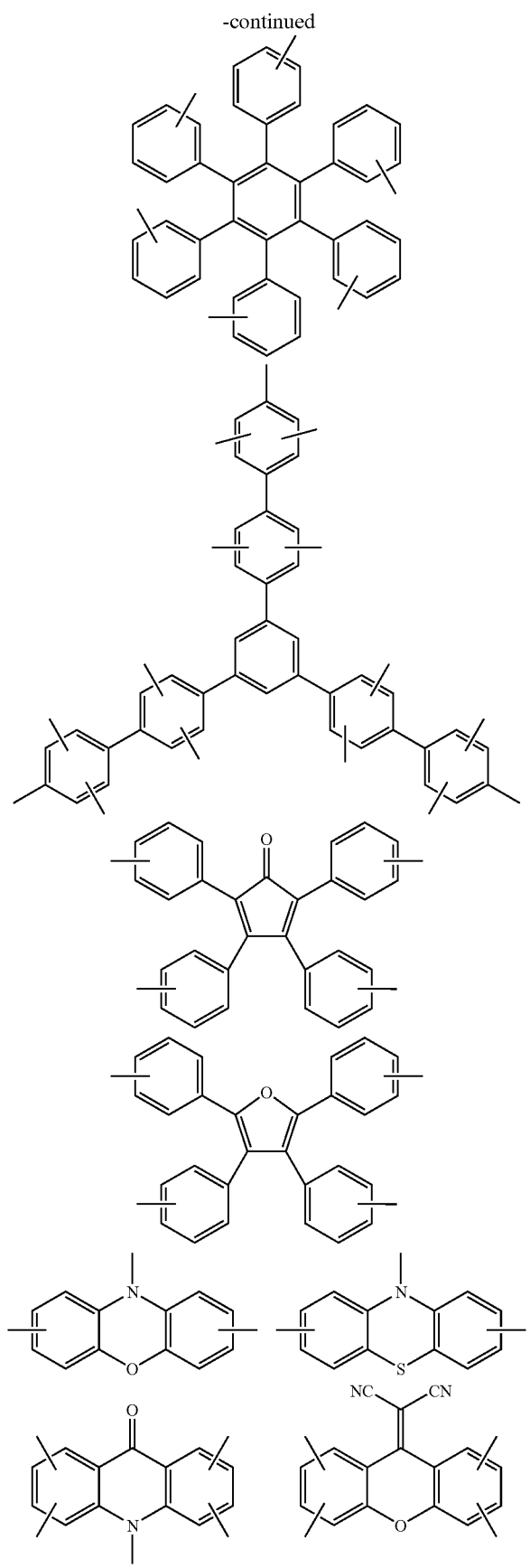

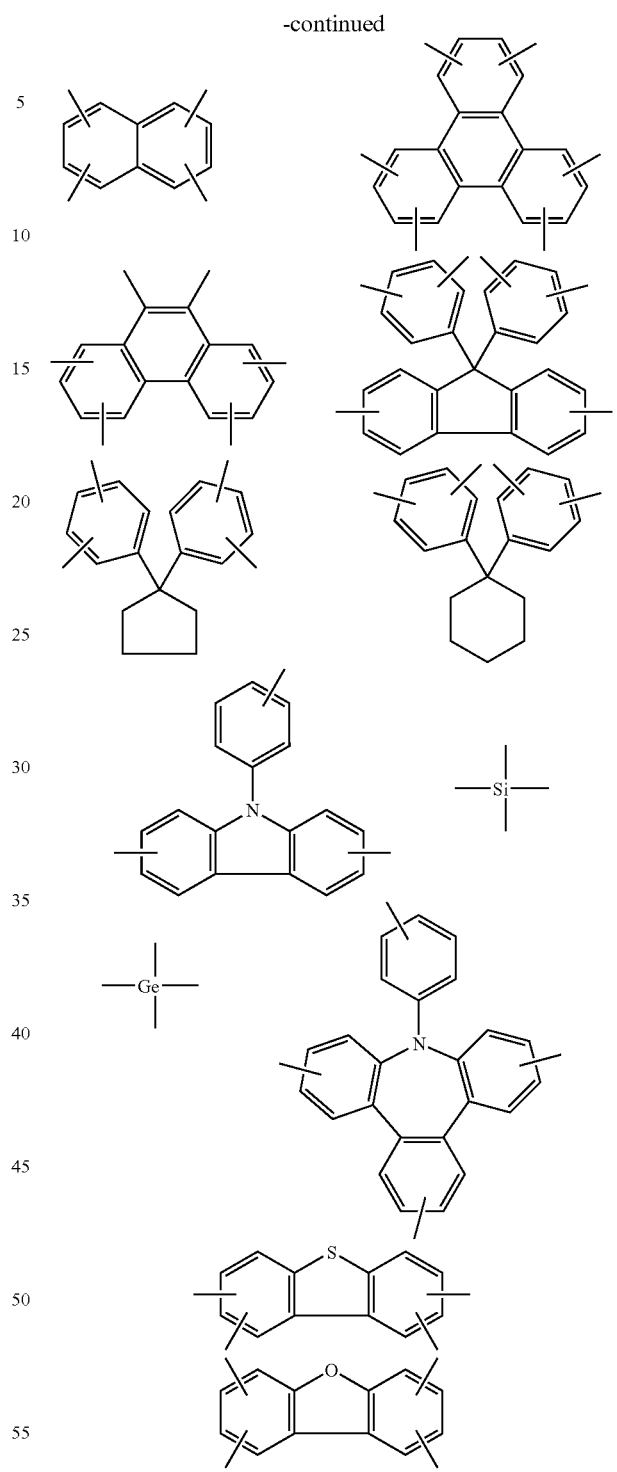

n represents an integer of 2 or more; preferably 2 or more and not more than 10; more preferably 2 or more and not more than 6; and further preferably 2 or 3.

A is a chemical structure represented by the following formula (2). The chemical structure A represented by the formula (2) is bound to the connecting group represented by L in the formula (1) so that the connecting group represented by L is bound to a residue group made by removing hydrogen atom(s) and/or substituent(s) from the chemical structure A.

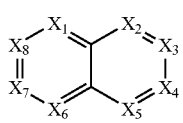

Formula (2)

In the formula (2), $X_1$ to $X_8$ each represents a substituted or unsubstituted carbon atom or a nitrogen atom. The number of nitrogen atom in $X_1$ to $X_8$ is preferably at least 1, more preferably 1 or more and not more than 6, and especially preferably 1 or more and not more than 3.

As the substituent on carbon, the foregoing W can be used. The substituent is preferably an alkyl group, an aryl group, or a heterocyclic group, and those as shown in W are preferable. The substituent is more preferably an aryl group or a heterocyclic group. Preferred examples of the aryl group and the heterocyclic group include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromenc ring, a xanthene ring, a phenoxathine ring, a phenothiazine ring, and a phenazine ring. Of these, a benzene ring, a naphthalene ring, an anthracene ring, a phenanthrene ring, a pyridine ring, a pyrazine ring, a pyrimidine ring, a pyridazine ring, a quinoline ring, a quinoxaline ring, an imidazole ring, an oxazole ring, and a thiazole ring are more preferable; and a benzene ring, a naphthalene ring, a pyridine ring, a pyrazine ring, a pyrimidine ring, a pyridazine ring, a quinoline ring, and a quinoxaline ring are especially preferable. These rings may further have a substituent. Such a substituent may be bound to form a ring if it is at all possible. Incidentally, those substituents may be the same or different.

Furthermore, these substituents on carbon may be taken together to form a ring if it is at all possible. Preferred examples of the ring which is formed include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a carboline ring, a phenanthridine ring, an acridine ring, a phenanthroline ring, a thianthrene ring, a chromene ring, a xanthene ring, a phenoxathine ring, a phenoxazine ring, a phenothiazine ring, a phenazine ring, a benzimidalone ring, a benzoxazolone ring, and a benzthiazolone ring. Of these, a benzene ring, a naphthalene ring, an anthracene ring, a pyridine ring, a pyrazine ring, a pyrimidine ring, and a pyridazine ring are more preferable. The formed ring may further have a substituent. Such a substituent may be bound to form a ring if it is at all possible.

The chemical structure represented by the formula (2) is preferably naphthalene, anthracene, phenanthrene, tetracene, pylene, perylene, fluoranthene, quinoline, quinoxaline, quinazoline, phthalazine, cinnoline, isoquinoline, pteridine, acridine, phenazine, phenanthroline, 1,8-naphthyridine, or a derivative thereof.

The chemical structure represented by the formula (2) is connected to L at any one of $X_1$ to $X_8$ or substituents thereof.

The chemical structure represented by A (formula (2)) in the formula (1) according to the invention is preferably represented by the following formula (3).

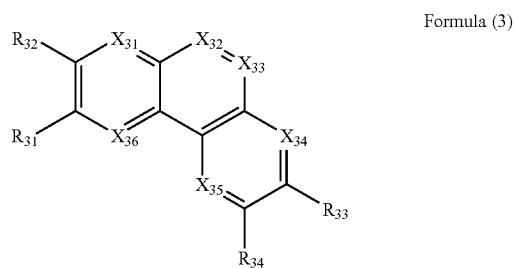

Formula (3)

$X_{31}$ to $X_{36}$ each represents a substituted or unsubstituted carbon atom or a nitrogen atom. The number of nitrogen atom in $X_{31}$ to $X_{36}$ is preferably at least 1, more preferably 1 or more and not more than 6, and especially preferably 1 or more and not more than 4.

As the substituent on carbon, the same substituents as in the foregoing $X_1$ to $X_8$ can be employed, and a preferred range thereof is also the same.

$R_{31}$ to $R_{34}$ each represents a hydrogen atom or a substituent. As the substituent on carbon, the same substituents as in the foregoing $X_1$ to $X_8$ can be employed, and a preferred range thereof is also the same.

The compound represented by the formula (3) is connected to L at any one of the carbon atoms which form a ring or substituents thereof.

The chemical structure represented by A (formula (2)) in the formula (1) according to the invention is preferably represented by the following formula (4).

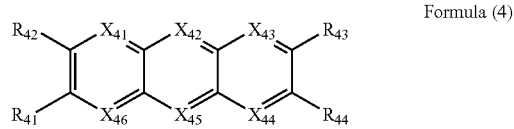

Formula (4)

$X_{41}$ to $X_{46}$ and $R_{41}$ to $R_{44}$ are synonymous with the foregoing $X_{31}$ to $X_{36}$ and $R_{31}$ to $R_{34}$, respectively, and specific examples and preferred examples thereof are also the same.

A mother nucleus represented by the formula (4) is connected to L at any one of the carbon atoms which form a ring or substituents thereof.

Specific examples of the compound represented by the formula (1) which are preferably used in the invention will be given below, but it should not be construed that the invention is limited thereto.

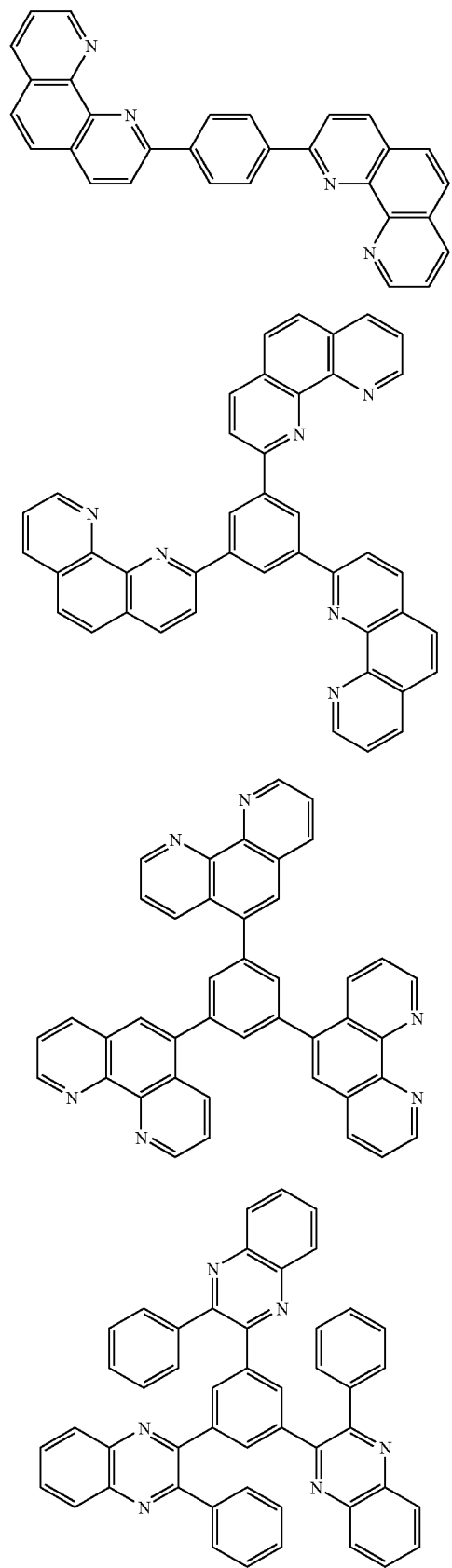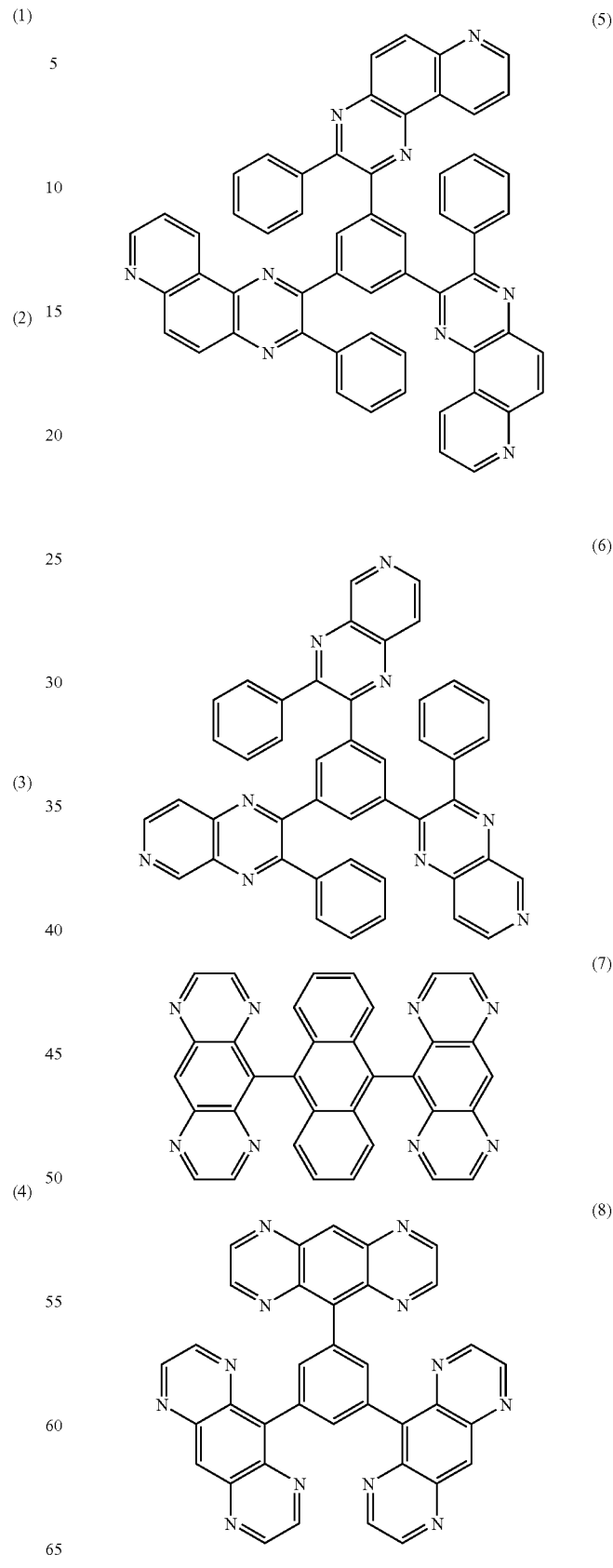

-continued
(9)
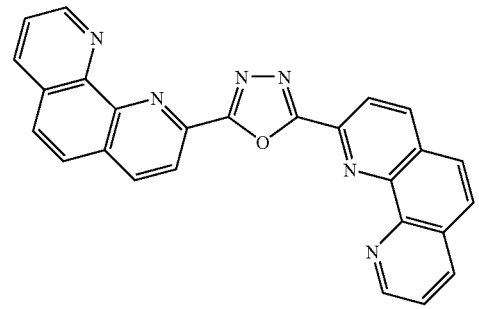
(10)
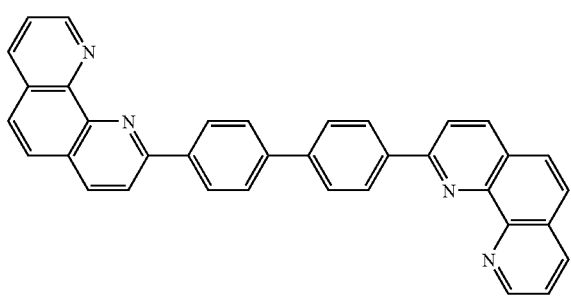
(11)
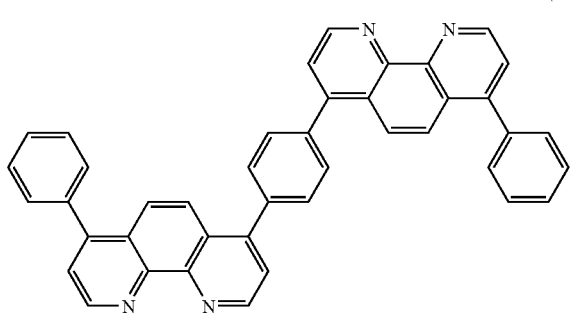
(12)
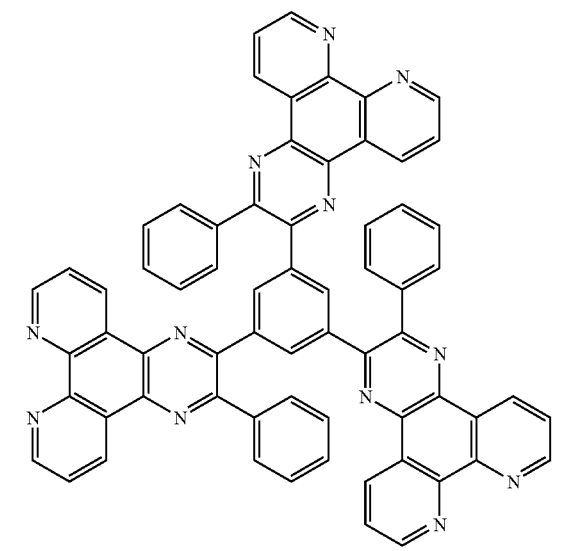
(13)
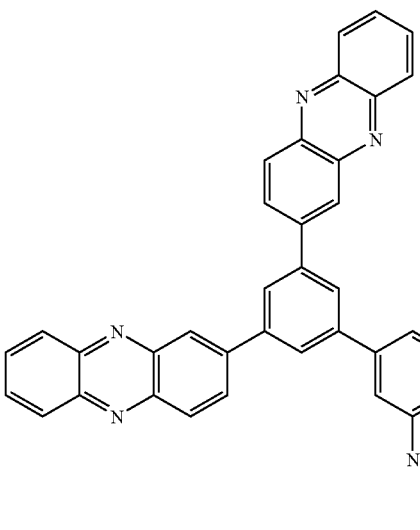
(14)
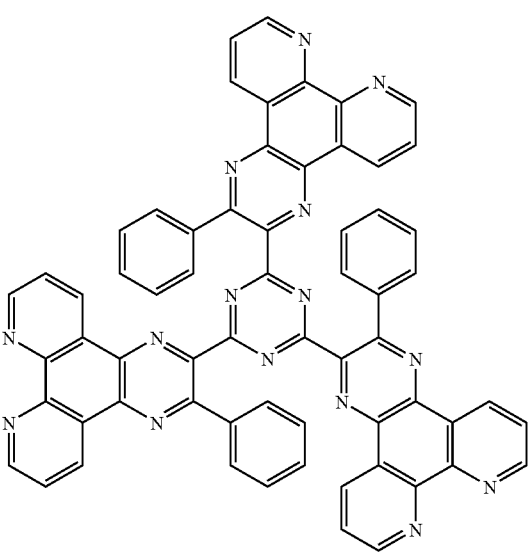
(15)
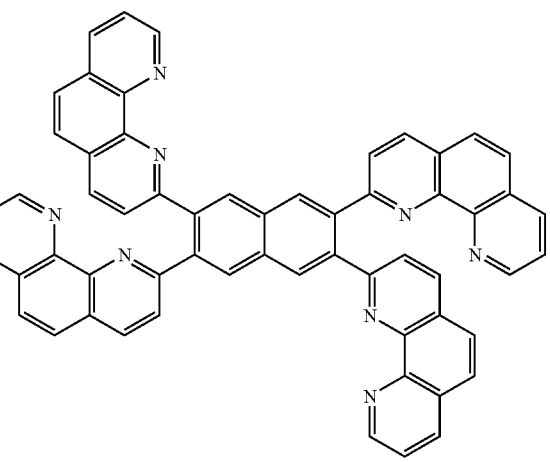

The compound according to the invention can be synthesized by, for example, a method as described in *Journal of Organic Chemistry*, Vol. 61, pages 3017 to 3022 (1996).

[Ionization Potential and Electron Affinity]

We have further found that the compound represented by the formula (1) according to the invention has preferred ranges of ionization potential and electron affinity. The ionization potential is preferably 5.0 eV or more and not more than 8.5 eV, more preferably 5.5 eV or more and not more than 8.0 eV, and especially preferably 6.0 eV or more and not more than 8.0 eV. The affinity is preferably 2.0 eV or more and not more than 5.0 eV, more preferably 2.5 eV or more and not more than 4.5 eV, and especially preferably 3.0 eV or more and not more than 4.5 eV.

When each of the ionization potential and the electron affinity of the organic dye compound according to the invention falls within the foregoing range, it has been found that not only an advantage that photoelectric conversion efficiency of the resulting photoelectric conversion layer is high, but also an S/N ratio of the photoelectric conversion layer is improved.

The ionization potential can be determined by measuring a vapor deposited layer of the organic dye compound using photo-electron spectroscopy in air (AC-1, as manufactured by Rikenkiki Co., Ltd.), vacuum ultraviolet photoemission spectroscopy (UPS), or the like. Furthermore, the electron affinity can be determined by measuring an ultraviolet-visible absorption spectrum of the same vapor deposited layer and subtracting an energy gap as calculated a long wave end of the resulting spectrum from the ionization potential.

[Fluorescence]

We have further found that the organic dye compound according to the invention has a preferred range of each of fluorescent quantum yield and fluorescent life. The fluorescent quantum yield is preferably 0.1 or more and not more than 1, more preferably 0.5 or more and not more than 1, and especially preferably 0.8 or more and not more than 1. The fluorescent life is preferably 10 ps or more, more preferably 40 ps or more, and especially preferably 160 ps or more. Though there is no upper limit in the fluorescent life, the fluorescent life is preferably not more than 1 ms.

The fluorescent quantum yield can be measured by a method as described in JP-A-63-138341. This method will be hereunder described. That is, the fluorescent quantum yield of a dye in a layer can be basically measured by the sane method as in the case of a luminescent quantum yield of a solution. Usually, the fluorescent quantum yield can be determined through relative measurement for comparing an intensity of incident light in a fixed optical orientation and a luminous intensity of a sample by referring to a standard sample having a known absolute quantum yield (for example, Rhodamine B, quinine sulfate, and 9,10-diphenylanthracene). This relative measurement method is described in, for example, C. A. Parker and W. T. Rees, *Analyst*, 1960, Vol. 85, page 587. In the invention, though the fluorescent quantum yield may be a value in any of a solution state or a layer state, it is preferably a value in a layer state.

The fluorescent life of the organic dye compound according to the invention can be measured by a method as described in Tadaaki Tani, Takeshi Suzumoto, Klaus Kernnitz and Keitaro Yoshihara, *The Journal of Physical Chemistry*, 1992, Vol. 96, page 2778.

[Organic Layer]

An organic layer (organic film) in the invention will be hereunder described. An electromagnetic wave absorption/photoelectric conversion site made of an organic layer according to the invention comprises an organic layer which is interposed between one pair of electrodes. The organic layer is formed by superposing or mixing a site for absorbing electromagnetic waves, a photoelectric conversion site, an electron transport site, a hole transport site, an electron blocking site, a hole blocking site, a crystallization preventing site, an electrode, an interlaminar contact improving site, and so on.

It is preferable that the organic layer contains an organic p-type semiconductor (compound) and an organic n-type semiconductor (compound), and any substance may be employed. Furthermore, though the organic layer may or may not have absorption in visible and infrared regions, it is preferable that the organic layer uses at least one compound (organic dye) having absorption in a visible region. In addition, it is possible to use a p-type compound and an n-type compound and add an organic dye to each of these compounds.

The organic p-type semiconductor (compound) is an organic semiconductor (compound) having donor properties and refers to an organic compound which is mainly represented by a hole transport organic compound and which has properties such that it is liable to provide an electron. In more detail, the organic p-type semiconductor refers to an organic compound having a smaller ionization potential in two organic compounds when they are brought into contact with each other and used. Accordingly, with respect to the organic compound having donor properties, any organic compound can be used so far as it is an electron donating organic compound. Useful examples thereof include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (for example, naphthalene derivatives, anthracene derivatives, phenanthrene derivatives, tetracene derivatives, pyrene derivatives, perylene derivatives, and fluoranthenc derivatives), and metal complexes having, as a ligand, a nitrogen-containing heterocyclic compound. Incidentally, the invention is not limited to these compounds, and as described previously, an organic compound having a smaller ionization potential than that of an organic compound to be used as an n-type compound (having acceptor properties) may be used as the organic semiconductor having donor properties.

The organic n-type semiconductor (compound) is an organic semiconductor (compound) having acceptor properties and refers to an organic compound which is mainly represented by an electron transport organic compound and which has properties such that it is liable to accept an electron. In more detail, the organic n-type semiconductor refers to an organic compound having a larger electron affinity in two organic compounds when they are brought into contact with each other and used. Accordingly, with respect to the organic compound having acceptor properties, any organic compound can be used so far as it is an electron accepting organic compound. Useful examples thereof include fused aromatic carbocyclic compounds (for example, naphthalene derivatives, anthracene derivatives, phenanthrene derivatives, tetracene derivatives, pyrene derivatives, perylene derivatives, and fluoranthene derivatives), 5- to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine), polyarylene compounds, fluorene compounds, cyclopentadiene compounds, silyl compounds, and metal complexes having, as a ligand, a nitrogen-containing heterocyclic compound. Incidentally, the invention is not limited to these compounds, and as described previously, an organic compound having a larger electron affinity than that of an organic compound to be used as an organic compound having donor properties may be used as the organic semiconductor having acceptor properties.

Though any organic dye may be used as the organic dye which is used in the organic layer, it is preferred to use a p-type organic dye or an n-type organic dye. Though any organic dye is useful, preferred examples thereof include cyanine dyes, styryl dyes, hemicyanine dyes, merocyanine dyes (inclusive of zeromethinemerocyanine (simple merocyanine)), trinucicar merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrropyrrole dyes, dioxane dyes, porphyrin dyes, chlorophyll dyes, phthalocyanine dyes, metal complex dyes, and fused aromatic carbocyclic compounds (for example, naphthalene derivatives, anthracene derivatives, phenanthrene derivatives, tetracene derivatives, pyrene derivatives, perylene derivatives, and fluoranthene derivatives).

As the color imaging device which is one of the objects of the invention, there may be the case where a methine dye having a high degree of freedom for adjusting the absorption wavelength, such as cyanine dyes, styryl dyes, hernicyanine dyes, merocyanine dyes, trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, and azamethine dyes, gives adaptability to the wavelength.

Details of such methine dyes are described in the following dye documents.

[Dye Documents]

F. M. Harmer, *Heterocyclic Compounds—Cyanine Dyes and Related Compounds*, John Wiley & Sons, New York and London, 1964; D. M. Sturmer, *Heterocyclic Compounds—Special topics in heterocyclic chemistry*, Chapter 18, Paragraph 14, pages 482 to 515, John Wiley & Sons, New York and London, 1977; *Rodd's Chemistry of Carbon Compounds*, 2nd Ed., Vol. IV, Part B, 1977, Chapter 15, pages 369 to 422, Elsevier Science Publishing Company Inc., New York; and so on.

In addition, dyes as described in *Research Disclosure (RD)* 17643, pages 23 to 24; *RD* 187716, page 648, right-hand column to page 649, right-hand column; *RD* 308119, page 996, right-hand column to page 998, right-hand column; and European Patent No. 0565096A1, page 65, lines 7 to 10 can be preferably used. Furthermore, dyes having a partial structure or a structure represented by a formula or a specific example, as described in U.S. Pat. No. 5,747,236 (in particular, pages 30 to 39), U.S. Pat. No. 5,994,051 (in particular, pages 32 to 43), and U.S. Pat. No. 5,340,694 (in particular, pages 21 to 58, with proviso that in the dyes represented by (XI), (XII) and (XIII), the number of each of $n_{12}$, $n_{15}$, $n_{17}$ and $n_{18}$ is not limited and is an integer of 0 or more (preferably not more than 4)) can be preferably used, too.

Next, the metal complex compound will be described. The metal complex compound is a metal complex having a ligand containing at least one of a nitrogen atom, an oxygen atom and a sulfur atom as coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands as described in H. Yersin, *Photochemistry and Photophysics of Coordination Compounds*, Springer-Verlag, 1987; and Akio Yamamoto, *Organometallic Chemistry—Principles and Applications*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, a quinolinol ligand, and a hydroxyphenylazole ligand (for example, a hydroxyphenylbenzimidazole ligand, a hydroxyphenylbenzoxazole ligand, and a hydroxyphenylimidazole ligand), an alkoxy ligand (having preferably from 1 to 30 carbon atoms, more preferably from 1 to 20 carbon atoms, and especially preferably from 1 to 10 carbon atoms, examples of which include methoxy, ethoxy, butoxy, and 2-ethylhexyloxy), an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethylphenyloxy, and 4-biphenyloxy), an aromatic heterocyclic oxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio), a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, an aromatic heterocyclic oxy ligand, or a siloxy ligand; and further preferably a nitrogen-containing heterocyclic ligand, an aryloxy ligand, or a siloxy ligand.

The layer which the organic dye forms may be in any of an amorphous state, a liquid crystal state or a crystal state. In the case where the layer is used in a crystal state, it is preferred to use a pigment.

A blending ratio of the p-type organic semiconductor and the n-type organic semiconductor in the interlayer (bulk heterojunction structure) of the photoelectric conversion layer can be properly set up within the range of from 0.1/99.9 to 99.9/0.1 in terms of a weight ratio.

[Orientation Control of Organic Layer]

In the invention, the orientation control as described below can be applied.

In the invention, it is preferable that the orientation of the organic compound has an order as compared with random orientation. Unless the orientation is random, the degree of order may be low or high. The orientation of the organic compound is preferably in a high order.

In the photoelectric conversion layer having a layer of a p-type semiconductor and a layer of an n-type semiconductor (preferably a mixed or dispersed (bulk heterojunction structure) layer) between one pair of electrodes, the case of a photoelectric conversion layer which is characterized by containing an orientation-controlled organic compound in at least one of the p-type semiconductor and the n-type semiconductor is preferable; and the case of a photoelectric conversion layer which is characterized by containing an orientation-controlled (orientation controllable) organic compound in both the p-type semiconductor and the n-type semiconductor is more preferable.

As the organic compound which is used in the organic layer of the photoelectric conversion device, an organic compound having a $\pi$-conjugated electron is preferably used. The $\pi$-electron plane is not vertical to a substrate (electrode substrate) and is oriented at an angle close to parallel to the substrate as far as possible. The angle against the substrate is preferably 0° or more and not more than 80°, more preferably 0° or more and not more than 60°, further preferably 0° or more and not more than 40°, still further preferably 0° or more and not more than 20°, especially preferably 0° or more and not more than 10°, and most preferably 0° (namely, in parallel to the substrate).

As described previously, it is only required that even a part of the layer of the orientation-controlled organic compound is contained over the whole of the organic layer. A proportion of the orientation-controlled portion to the whole of the organic layer is preferably 10% or more, more preferably 30% or more, further preferably 50% or more, still further preferably 70% or more, especially preferably 90% or more, and most preferably 100%. In the photoelectric conversion layer, by controlling the orientation of the organic compound of the organic layer, the foregoing state compensates a drawback that the organic layer in the photoelectric conversion layer has a short carrier diffusion length, thereby improving the photoelectric conversion efficiency.

The orientation of the organic compound can be controlled by selecting the substrate, adjusting the vapor deposition condition, and other means. For example, there is enumerated a method in which the surface of the substrate is subjected to a rubbing treatment, thereby imparting anisotropy to the organic compound to be grown thereon. However, the structure relying upon a crystal as the substrate is observed only in the thickness of at most ten-odd layers, and when the layer thickness becomes thick, a bulk crystal structure is taken. In the photoelectric conversion device according to the invention, in order to increase the optical absorptance, the case where the layer thickness is 100 nm or more (100 layers or more as the molecule) is preferable. In such case, the orientation must be controlled by utilizing a mutual action among the organic compounds in addition to the substrate.

Any force of the mutual action among the organic compounds is employable. Examples of an intermolecular force include a van der Waals force (in more detail, the van der Waals force can be expressed while classifying into an orientation force to work between a permanent dipole and a permanent dipole, an induction force to work between a permanent dipole and an induced dipole, and a dispersion force to work between a temporary dipole and an induced dipole), a charge transfer force (CT), a Coulomb's force (electrostatic force), a hydrophobic bond force, a hydrogen bond force, and a coordination bond force. These bond forces can be used singly or in an arbitrary combination of plural bond forces.

Of these, a van der Waals force, a charge transfer force, a Coulomb's force, a hydrophobic bond force, and a hydrogen bond force are preferable; a van der Waals force, a Coulomb's force, and a hydrogen bond force are more preferable; a van der Waals force and a Coulomb's force are especially preferable; and a van der Waals force is the most preferable.

In the invention, as the mutual action among the organic compounds, a covalent bond or a coordination bond can also be employed. The case where the organic compounds are connected to each other via a covalent bond is preferable (incidentally, the coordination bond force can be considered as one coordination bond force of the intermolecular force). In such case, the covalent bond or the coordination bond may be formed in advance or may be formed during the process for forming an organic layer.

With respect to the foregoing intermolecular force and covalent bond, it is preferable that the orientation of an organic compound is controlled by using an intermolecular force.

Energy of the attraction of the intermolecular force is preferably 15 kJ/mole or more, more preferably 20 kJ/mole or more, and especially preferably 40 kJ/mole or more. Though there is no particular upper limit, the energy is preferably not more than 5,000 kJ/mole, and more preferably not more than 1,000 kJ/mole.

Furthermore, there can be employed a method in which dielectric anisotropy or polarization is imparted to an organic compound and an electric field is applied during the growth to orient the molecule.

In the case where the orientation of an organic compound is controlled, it is more preferable that the heterojunction plane (for example, a pn junction plane) is not in parallel to a substrate. In this case, it is preferable that the heterojunction plane is not in parallel to the substrate (electrode substrate) but is oriented at an angle close to verticality to the substrate as far as position. The angle to the substrate is preferable 0° or more and not more than 90°, more preferably 30° or more and not more than 90°, further preferably 50° or more and not more than 90°, still further preferably 70° or more and not more than 90°, especially preferably 80° or more and not more than 90°, and most preferably 90° (namely, vertical to the substrate).

As described previously, it is only required that even a part of the layer of the heterojunction plane-controlled organic compound is contained over the whole of the organic layer. A proportion of the orientation-controlled portion to the whole of the organic layer is preferably 10% or more, more preferably 30% or more, further preferably 50% or more, still further preferably 70% or more, especially preferably 90% or more, and most preferably 100%. In such case, the area of the heterojunction plane in the organic layer increases and the amount of a carrier such as an electron as formed on the interface, a hole, and a pair of an electron and a hole increases so that it is possible to improve the photoelectric conversion efficiency.

As examples of concrete drawings of a photoelectric conversion layer having the foregoing heterojunction layer (plane), ones described in FIGS. 1 to 8 of JP-A-2003-298152 are applicable.

In the light of the above, in the photoelectric conversion layer in which the orientation of the organic compound on both the heterojunction plane and the π-electron plane is controlled, in particular, it is possible to improve the photoelectric conversion efficiency and therefore, such is preferable. Especially, the case in which a bulk heterojunction structure is taken can be preferably employed.

(Formation Method of Organic Layer)

A layer containing such an organic compound is subjected to film formation by a dry film formation method or a wet film formation method. Specific examples of the dry film formation method include physical vapor phase epitaxy methods such as a vacuum vapor deposition method, a sputtering method, an ion plating method, and an MBE method and CVD methods such as plasma polymerization. Examples of the wet film formation method include a casting method, a spin coating method, a dipping method, and an LB method.

In the case of using a high molecular compound in at least one of the p-type semiconductor (compound) and the n-type semiconductor (compound), it is preferable that the film formation is achieved by a wet film formation method which is easy for the preparation. In the case of employing a dry film formation method such as vapor deposition, the use of a high molecular compound is difficult because of possible occurrence of decomposition. Accordingly, its oligomer can be preferably used instead of that.

On the other hand, in the case of using a low molecular compound, a dry film formation method is preferably employed, and a vacuum vapor deposition method is especially preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are a basic parameter. In order to achieve uniform vapor deposition, it is preferable that the vapor deposition is carried out while rotating the substrate. A high degree of vacuum is preferable. The vacuum vapor deposition is carried out at a degree of vacuum of not more than $10^{-4}$ Torr, preferably not more than $10^{-6}$ Torr, and especially preferably not more than $10^{-8}$ Torr. It is preferable that all steps at the time of vapor deposition are carried out in vacuo. Basically, the vacuum vapor position is carried out in such a manner that the compound does not come into direct contact with the external oxygen and moisture. The foregoing conditions of the vacuum vapor deposition must be strictly controlled because they affect crystallinity, amorphous properties, density, compactness, and so no. It is preferably employed to subject the vapor deposition rate to PI or PID control using a layer thickness monitor such as a quartz oscillator and an interferometer. In the case of vapor depositing two or more kinds of compounds at the same time, a co-vapor deposition method, a flash vapor deposition method and so on can be preferably employed.

[Definition of Absorption Wavelength]

We have found that the organic dye compound according to the invention has a preferred range of each of spectral absorption wavelength and spectral sensitivity regions.

In the invention, a BGR photoelectric conversion layer with good color reproducibility, namely a photoelectric conversion device having three layers of a blue photoelectric conversion layer, a green photoelectric conversion layer and a red photoelectric conversion layer stacked thereon can be preferably used. The case where each of the photoelectric conversion layers has the following spectral absorption and/or spectral sensitivity characteristics is preferable.

When spectral absorption maximum values are respectively designated as λmax1, λmax2 and λmax3 in the order of BGR and spectral sensitivity maximum values are respectively designated as Smax1, Smax2 and Smax3 in the order of BGR, the λmax1 and the Smax1 are each preferably in the range of 400 nm or more and not more than 500 nm, more preferably in the range of 420 nm or more and not more than 480 nm, and especially preferably in the range of 430 nm or more and not more than 470 nm; the λmax2 and the Smax2 are each preferably in the range of 500 nm or more and not more than 600 nm, more preferably in the range of 520 nm or more and not more than 580 nm, and especially preferably in the range of 530 nm or more and not more than 570 nm; and the λmax3 and the Smax3 are each preferably in the range of 600 nm or more and not more than 700 nm, more preferably in the range of 620 nm or more and not more than 680 nm, and especially preferably in the range of 630 nm or more and not more than 670 nm.

Furthermore in the case of the photoelectric conversion layer according to the invention takes a stacked structure of three or more layers, a gap between a shortest wavelength and a longest wavelength exhibiting 50% of each of the spectral maximum absorption of each of λmax1, λmax2 and λmax3 and the spectral maximum sensitivity of each of Smax1, Smax2 and Smax3 is preferably not more than 120 nm, more preferably not more than 100 nm, especially preferably not more than 80 nm, and most preferably not more than 70 nm.

Furthermore, in the case of the photoelectric conversion layer according to the invention takes a stacked structure of three or more layers, a gap between a shortest wavelength and a longest wavelength exhibiting 80% of each of the spectral maximum absorption of each of λmax1, λmax2 and λmax3 and the spectral maximum sensitivity of each of Smax1, Smax2 and Smax3 is preferably 20 nm or more and preferably not more than 100 nm, more preferably not more than 80 nm, and especially preferably not more than 50 nm.

Furthermore, in the case of the photoelectric conversion layer according to the invention takes a stacked structure of three or more layers, a gap between a shortest wavelength and a longest wavelength exhibiting 20% of each of the spectral maximum absorption of each of λmax1, λmax2 and λmax3 and the spectral maximum sensitivity of each of Smax1, Smax2 and Smax3 is preferably not more than 180 nm, more preferably not more than 150 nm, especially preferably not more than 120 nm, and most preferably not more than 100 nm.

Furthermore, in the long wavelength sides of λmax1, λmax2 and λmax3 and Smax1, Smax2 and Smax3, a longest wavelength exhibiting a spectral absorptance of 50% of each of the spectral maximum absorption of each of λmax1, λmax2 and λmax3 and the spectral maximum sensitivity of each of Smax1, Smax2 and Smax3 is preferably 460 nm or more and not more than 510 nm for λmax1 and Smax1, 560 nm or more and not more than 610 nm for λmax2 and Smax2 and 640 nm or more and not more than 730 nm for λmax3 and Smax3, respectively.

When the spectral absorption wavelength and spectral sensitivity region ranges of the compound according to the invention fall within the foregoing ranges, it is possible to improve the color reproducibility of color images obtained by the imaging device.

[Definition of Layer Thickness of Organic Dye Layer]

In the case of using the photoelectric conversion layer according to the invention as a color imaging device (image sensor), for the purposes of improving the photoelectric conversion efficiency and further improving color separation without passing excessive light through a lower layer, an optical absorptance of the organic dye layer of each of B, G and R layers is preferably set up at 50% or more, more preferably 70% or more, especially preferably 90% (absorbance=1) or more, and most preferably 99% or more. Accordingly, from the standpoint of optical absorption, it is preferable that the layer thickness of the organic dye layer is as thick as possible. However, taking into consideration a proportion for contributing to the charge separation, the layer thickness of the organic dye layer in the invention is preferably 30 nm or more and not more than 300 nm, more preferably 50 nm or more and not more than 250 nm, especially preferably 60 nm or more and not more than 200 nm, and most preferably 80 nm or more and not more than 130 nm.

[Application of Voltage]

The case of applying voltage to the photoelectric conversion layer according to the invention is preferable in view of improving the photoelectric conversion efficiency. Though any voltage is employable as the voltage to be applied, necessary voltage varies with the layer thickness of the photoelectric conversion layer. That is, the larger an electric field to be added in the photoelectric conversion layer, the more improved the photoelectric conversion efficiency is. However, even when the same voltage is applied, the thinner the layer thickness of the photoelectric conversion layer, the larger an electric field to be applied is. Accordingly, in the case where the layer thickness of the photoelectric conversion film is thin, the voltage to be applied may be relatively small. The electric field to be applied to the photoelectric conversion layer is preferably $10^{-2}$ V/cm or more, more preferably 10 V/cm or more, further preferably $1 \times 10^3$ V/cm or more, especially preferably $1 \times 10^4$ V/cm or more, and most preferably $1 \times 10^5$ V/cm or more. Though there is no particular upper limit, when the electric field is excessively applied, an electric current flows even in a dark place and therefore, such is not preferable. The electric field is preferably not more than $1 \times 10^{10}$ V/cm, and more preferably not more than $1 \times 10^7$ V/cm.

[General Requirements]

In the invention, the photoelectric conversion device is preferably a construction where at least two layers are stacked, more preferably a construction where three layers or four layers are stacked, and especially preferably a construction where three layers are stacked.

In the invention, such a photoelectric conversion device can be preferably used as an imaging device, and especially preferably as a solid imaging device. Furthermore, in the invention, the case where voltage is applied to the photoelectric conversion layer, the photoelectric conversion device and the imaging device.

The case where the photoelectric conversion device according to the invention has a photoelectric conversion layer having a stacked structure in which a layer of the p-type semiconductor and a layer of the n-type semiconductor are disposed between one pair of electrodes is preferable. Furthermore, the case where at least one of the p-type semiconductor and the n-type semiconductor contains an organic compound is preferable; and the case where both the p-type semiconductor and the n-type semiconductor contain an organic compound is more preferable.

[Bulk Heterojunction Structure]

In the invention, the case containing a photoelectric conversion layer (photosensitive layer) having a p-type semiconductor layer and an n-type semiconductor layer between one pair of electrodes, with at least one of the p-type semiconductor layer and the n-type semiconductor layer being an organic semiconductor, and a bulk heterojunction structure layer containing the p-type semiconductor and the n-type semiconductor as an interlayer between these semiconductor layers is preferable. In such case, in the photoelectric conversion layer, by containing a bulk heterojunction structure in the organic layer, a drawback that the organic layer has a short carrier diffusion length is compensated, thereby improving the photoelectric conversion efficiency.

Incidentally, the bulk beterojunction structure is described in detail in Japanese Patent Application No. 2004-080639.

[Tandem Structure]

In the invention, the case containing a photoelectric conversion layer (photosensitive layer) having a structure having the number of a repeating structure (tandem structure) of a pn junction layer formed of the p-type semiconductor layer and the n-type semiconductor layer between one pair of electrodes of 2 or more is preferable. Furthermore, a thin layer made of a conducting material may be inserted between the foregoing repeating structures. The conducting material is preferably silver or gold, and most preferably silver. The number of the repeating structure (tandem structure) of a pn junction layer is not limited. For the purpose of enhancing the photoelectric conversion efficiency, the number of the repeating structure (tandem structure) of a pn junction layer is preferably 2 or more and not more than 100, more preferably 2 or more and not more than 50, especially preferably 5 or more and not more than 40, and most preferably 10 or more and not more than 30.

In the invention, though the semiconductor having a tandem structure may be made of an inorganic material, it is preferably an organic semiconductor, and more preferably an organic dye.

Incidentally, the tandem structure is described in detail in Japanese Patent Application No. 2004-079930.

[Stacked Structure]

As one preferred embodiment of the invention, in the case where voltage is not applied to the photoelectric conversion layer, it is preferable that at least two photoelectric conversion layers are stacked. The stacked imaging devices is not particularly limited, and all stacked imaging device which are used in this field are applicable. However, a BGR three-layer stacked structure is preferable. A preferred example of the BGR stacked structure is shown in FIG. 1.

Next, for example, the solid imaging device according to the invention has a photoelectric conversion layer as shown in this embodiment. The solid imaging device as shown in FIG. 1 is provided with a stack type photoelectric conversion layer on a scanning circuit part. For the scanning circuit part, a construction in which an MOS transistor is formed on a semiconductor substrate for every pixel unit or a construction having CCD as an imaging device can be properly employed.

For example, in the case of a solid imaging device using an MOS transistor, a charge is generated in a photoelectric conversion layer by incident light which has transmitted through electrodes; the charge runs to the electrodes within the photoelectric conversion layer by an electric field as generated between the electrodes by applying voltage to the electrodes; and the charge is further transferred to a charge accumulating part of the MOS transistor and accumulated in the charge accumulating part. The charge as accumulated in the charge accumulating part is transferred to a charge read-out part by switching of the MOS transistor and further outputted as an electric signal. In this way, full-color image signals are inputted in a solid imaging device including a signal processing part.

Figure 2:
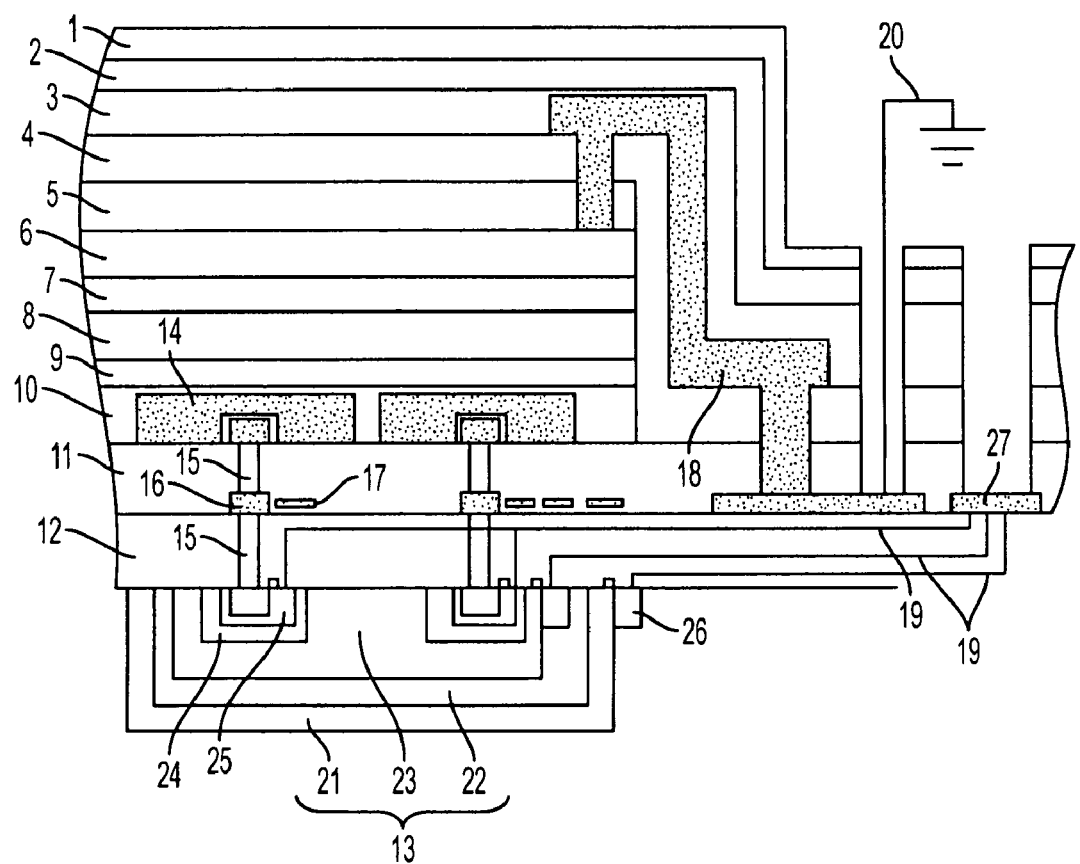
FIG. 2 is a cross-sectional schematic view of one pixel of a photoelectric conversion layer stacked imaging device of a BRR three-layer stack according to the invention.

With respect to such a stacked imaging device, solid color imaging devices represented by those described in FIG. 2 of JP-A-58-103165 and in FIG. 2 of JP-A-58-103166 and so on can also be applied.

With respect to the manufacturing process of the foregoing stack type imaging device, preferably a three-layer stack type imaging device, a method as described in JP-A-2002-83946 (see FIGS. 7 to 23 and paragraphs [0026] to [0038] of JP-A-2002-83946) can be applied.

(Photoelectric Conversion Device)

The photoelectric conversion device of a preferred embodiment according to the invention will be hereunder described.

The photoelectric conversion device according to the invention is comprised of an electromagnetic wave absorption/photoelectric conversion site and a charge accumulation of charge as generated by photoelectric conversion/transfer/ and read-out site.

In the invention, the electromagnetic wave absorption/photoelectric conversion site has a stack type structure made of at least two layers, which is capable of absorbing each of blue light, green light and red light and undergoing photoelectric conversion. A blue light absorbing layer (B) is able to absorb at least light of 400 nm or more and not more than 500 nm and preferably has an absorptance of a peak wavelength in that wavelength region of 50% or more. A green light absorbing layer (G) is able to absorb at least light of 500 nm or more and not more than 600 nm and preferably has an absorptance of a peak wavelength in that wavelength region of 50% or more. A red light absorbing layer (R) is able to absorb at least light of 600 nm or more and not more than 700 nm and preferably has an absorptance of a peak wavelength in that wavelength region of 50% or more. The order of these layers is not limited. In the case of a three-layer stack type structure, orders of BOR, BRG, GBR, GRB, RBG and RGB from the upper layer (light incident side) are possible. It is preferable that the uppermost layer is G. In the case of a two-layer stack type structure, when the upper layer is an R layer, a BG layer is formed as the lower layer in the same planar state; when the upper layer is a B layer, a GR layer is formed as the lower layer in the same planar state; and when the upper layer is a G layer, a BR layer is formed as the lower layer in the same planar state. It is preferable that the upper layer is a G layer and the lower layer is a BR layer in the same planar state. In the case where two light absorbing layers are provided in the same planar state of the lower layer in this way, it is preferable that a filter layer capable of undergoing color separation is provided in, for example, a mosaic state on the upper layer or between the upper layer and the lower layer. Under some circumstances, it is possible to provide a fourth or polynomial layer as a new layer or in the same planar state.

In the invention, the charge accumulation/transfer/read-out site is provided under the electromagnetic wave absorption/photoelectric conversion site. It is preferable that the electromagnetic wave absorption/photoelectric conversion site which is the lower layer also serves as the charge accumulation/transfer/read-out site.

In the invention, the electromagnetic wave absorption/photoelectric conversion site is made of an organic layer or an inorganic layer or a mixture of an organic layer and an inorganic layer. The organic layer may form a B/G/R layer or the inorganic layer may form a B/G/R layer It is preferable that the electromagnetic wave absorption/photoelectric conversion site is made of a mixture of an organic layer and an inorganic layer. In this case, basically, when the organic layer is made of a single layer, the inorganic layer is made of a single layer or two layers; and when the organic layer is made of two layers, the inorganic layer is made of a single layer. When each of the organic layer and the inorganic layer is made of a single layer, the inorganic layer forms an electromagnetic wave absorption/photoelectric conversion site of two or more colors in the same planar state. It is preferable that the upper layer is made of an organic layer which is constructed of a G layer and the lower layer is made of an inorganic layer which is constructed of a B layer and an R layer in this order from the upper side. Under some circumstances, it is possible to provide a fourth or polynomial layer as a new layer or in the same planar state. When the organic layer forms a B/G/R layer, a charge accumulation/transfer/read-out site is provided thereunder. When an inorganic layer is used as the electromagnetic wave absorption/photoelectric conversion site, this inorganic layer also serves as the charge accumulation/transfer/read-out site.

In the invention, the following is an especially preferred embodiment among the devices as described previously.

That is, the preferred embodiment is the case having at least two electromagnetic wave absorption/photoelectric conversion sites, with at least one site thereof being the device (imaging device) according to the invention.

In addition, the case of a device in which at least two electromagnetic wave absorption/photoelectric conversion sites have a stack type structure of at least two layers is preferable. In addition, the case where the upper layer is made of a site capable of absorbing green light and undergoing photoelectric conversion is preferable.

Furthermore, the case having at least three electromagnetic wave absorption/photoelectric conversion sites, with at least one site thereof being the photoelectric conversion device (preferably, imaging device) according to the invention is especially preferable.

In addition, the case of a device in which the upper layer is made of a site capable of absorbing green light and undergoing photoelectric conversion is preferable. In addition, the case where at least two electromagnetic wave absorption/photoelectric conversion sites of the three sites are made of an inorganic layer (which is preferably formed within a silicon substrate) is preferable.

(Electrode)

The electromagnetic wave absorption/photoelectric conversion site made of an organic layer according to the invention is interposed between one pair of electrodes, and a pixel electrode and a counter electrode are formed, respectively. It is preferable that the lower layer is a pixel electrode.

It is preferable that the counter electrode extracts a hole from a hole transport photoelectric conversion layer or a hole transport layer. As the counter electrode, a metal, an alloy, a metal oxide, an electrically conducting compound, or a mixture thereof can be used. It is preferable that the pixel electrode extracts an electron from an electron transport photoelectric conversion layer or an electron transport layer. The pixel electrode is selected while taking into consideration adhesion to an adjacent layer such as an electron transport photoelectric conversion layer and an electron transport layer, electron affinity, ionization potential, stability, and the like. Specific examples thereof include conducting metal oxides such as tin oxide, zinc oxide, indium oxide, and indium tin oxide (ITO); metals such as gold, silver, chromium, and nickel; mixtures or stacks of such a metal and such a conducting metal oxide; inorganic conducting substances such as copper iodide and copper sulfide; organic conducting materials such as polyaniline, polythiophene, and polypyrrole; silicon compounds; and stack materials thereof with ITO. Of these, conducting metal oxides are preferable; and ITO and IZO (indium zinc oxide) are especially preferable in view of productivity, high conductivity, transparency, and so on. Though the layer thickness can be properly selected depending upon the material, in general, it is preferably in the range of 10 nm or more and not more than 1 μm, more preferably in the range of 30 nm or more and not more than 500 nm, and further preferably in the range of 50 nm or more and not more than 300 nm.

In the preparation of the pixel electrode and the counter electrode, various methods are employable depending upon the material. For example, in the case of ITO, the layer is formed by a method such as an electron beam method, a sputtering method, a resistance heating vapor deposition method, a chemical reaction method (for example, a sol-gel method), and coating of a dispersion of indium tin oxide. In the case of ITO, a UV-ozone treatment, a plasma treatment, or the like can be applied.

In the invention, it is preferable that a transparent electrode layer is prepared in a plasma-free state. By preparing a transparent electrode layer in a plasma-free state, it is possible to minimize influences of the plasma against the substrate and to make photoelectric conversion characteristics satisfactory. Here, the term "plasma-free state" means a state that plasma is not generated during the film formation of a transparent electrode layer or that a distance from the plasma generation source to the substrate is 2 cm or more, preferably 10 cm or more, and more preferably 20 cm or more and that the plasma which reaches the substrate is reduced.

Examples of a device in which plasma is not generated during the film formation of a transparent electrode layer include an electron beam vapor deposition device (EB vapor deposition device) and a pulse laser vapor deposition device. With respect to the EB vapor deposition device or pulse laser vapor deposition device, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used. In the following, the method for achieving film formation of a transparent electrode film using an EB vapor deposition device is referred to as "EB vapor deposition method"; and the method for achieving film formation of a transparent electrode film using a pulse laser vapor deposition device is referred to as "pulse laser vapor deposition method".

With respect to the device capable of realizing the state that a distance from the plasma generation source to the substrate is 2 cm or more and that the plasma which reaches the substrate is reduced (hereinafter referred to as "plasma-free film formation device"), for example, a counter target type sputtering device and an arc plasma vapor deposition method can be thought. With respect to these matters, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used.

The electrode of the organic electromagnetic wave absorption/photoelectric conversion site according to the invention will be hereunder described in more detail. The photoelectric conversion layer as an organic layer is interposed between a pixel electrode layer and a counter electrode layer and can contain an interelectrode material or the like. The "pixel electrode layer" as referred to herein refers to an electrode layer as prepared above a substrate in which a charge accumulation/transfer/read-out site is formed and is usually divided for every one pixel. This is made for the purpose of obtaining an image by reading out a signal charge which has been converted by the photoelectric conversion layer on a charge accumulation/transfer/signal read-out circuit substrate for every one pixel.

The "counter electrode layer" as referred to herein has a function to discharge a signal charge having a reversed polarity to a signal charge by interposing the photoelectric conversion layer together with the pixel electrode layer. Since this discharge of a signal charge is not required to be divided among the respective pixels, the counter electrode layer can be usually made common among the respective pixels. For that reason, the counter electrode layer is sometimes called a common electrode layer.

The photoelectric conversion layer is positioned between the pixel electrode layer and the counter electrode layer. The photoelectric conversion function functions by this photoelectric convention layer and the pixel electrode layer and the counter electrode layer.

As examples of the construction of the photoelectric conversion layer stack, first of all, in the case where one organic layer is stacked on a substrate, there is enumerated a construction in which a pixel electrode layer (basically a transparent electrode layer), a photoelectric conversion layer and a counter electrode layer (transparent electrode layer) are stacked in this order from the substrate. However, it should not be construed that the invention is limited thereto.

In addition, in the case where two organic layers are stacked on a substrate, there is enumerated a construction in which a pixel electrode layer (basically a transparent electrode layer), a photoelectric conversion layer, a counter electrode layer (transparent electrode layer), an interlaminar insulating layer, a pixel electrode layer (basically a transparent electrode layer), a photoelectric conversion layer, and a counter electrode layer (transparent electrode layer) are stacked in this order from the substrate.

As the material of the transparent electrode layer which constructs the photoelectric conversion site according to the invention, materials which can be subjected to film formation by a plasma-free film formation device, EB vapor deposition device or pulse laser vapor deposition device. For example, metals, alloys, metal oxides, metal nitrides, metallic borides, organic conducting compounds, and mixtures thereof can be suitably enumerated. Specific examples thereof include conducting metal oxides such as tin oxide, zinc oxide, indium oxide, indium zinc oxide (IZO), indium tin oxide (ITO), and indium tungsten oxide (IWO); metal nitrides such as titanium nitride; metals such as gold, platinum, silver, chromium, nickel, and aluminum; mixtures or stacks of such a metal and such a conducting metal oxide; inorganic conducting substances such as copper iodide and copper sulfide; organic conducting materials such as polyaniline, polythiophene, and polypyrrole; and stacks thereof with ITO. Also, materials as described in detail in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein may be used.

As the material of the transparent electrode layer, any one material of ITO, IZO, $SnO_2$, ATO (antimony-doped tin oxide), ZnO, AZO (Al-doped zinc oxide), GZO (gallium-doped zinc oxide), $TiO_2$, or FTO (fluorine-doped tin oxide) is especially preferable.

A light transmittance of the transparent electrode layer is preferably 60% or more, more preferably 80% or more, further preferably 90% or more, and still further preferably 95% or more at a photoelectric conversion optical absorption peak wavelength of the photoelectric conversion layer to be contained in a photoelectric conversion device containing that transparent electrode layer. Furthermore, with respect to a surface resistance of the transparent electrode layer, its preferred range varies depending upon whether the transparent electrode layer is a pixel electrode or a counter electrode, whether the charge accumulation/transfer/read-out site is of a CCD structure or a CMOS structure, and the like. In the case where the transparent electrode layer is used for a counter electrode and the charge accumulation/transfer/read-out site is of a CMOS structure, the surface resistance is preferably not more than 10,000 $\Omega/\square$, and more preferably not more than 1,000 $\Omega/\square$. In the case where the transparent electrode layer is used for a counter electrode and the charge accumulation/transfer/read-out site is of a CCD structure, the surface resistance is preferably not more than 1,000 $\Omega/\square$, and more preferably not more than 100 $\Omega/\square$. In the case where the transparent electrode layer is used for a pixel electrode, the surface resistance is preferably not more than 1,000,000 $\Omega/\square$, and more preferably not more than 100,000 $\Omega/\square$.

Conditions at the time of film formation of a transparent electrode layer will be hereunder mentioned. A substrate temperature at the time of film formation of a transparent electrode layer is preferably not higher than 500° C., more preferably not higher than 300° C., further preferably not higher than 200° C., and still further preferably not higher than 150° C. Furthermore, a gas may be introduced during the film formation of a transparent electrode. Basically, though the gas species is not limited, Ar, He, oxygen, nitrogen, and so on can be used. Furthermore, a mixed gas of such gases may be used. In particular, in the case of an oxide material, since oxygen deficiency often occurs, it is preferred to use oxygen.

(Inorganic Layer)

An inorganic layer as the electromagnetic wave absorption/photoelectric conversion site will be hereunder described. In this case, list which has passed through the organic layer as the upper layer is subjected to photoelectric conversion in the inorganic layer. With respect to the inorganic layer, pn junction or pin junction of crystalline silicon, amorphous silicon, or a chemical semiconductor such as GaAs is generally employed. With respect to the stack type structure, a method as disclosed in U.S. Pat. No. 5,965,875 can be employed. That is, a construction in which a light receiving part as stacked by utilizing wavelength dependency of a coefficient of absorption of silicon is formed and color separation is carried out in a depth direction thereof In this case, since the color separation is carried out with a light penetration depth of silicon, a spectrum range as detected in each of the stacked light receiving parts becomes broad. However, by using the foregoing organic layer as the upper layer, namely by detecting the light which has transmitted through the organic layer in the depth direction of silicon, the color separation is remarkably improved. In particular, when a G layer is disposed in the organic layer, since light which has transmitted through the organic layer is B light and R light, only BR light is subjective to separation of light in the depth direction in silicon so that the color separation is improved. Even in the case where the organic layer is a B layer or an R layer, by properly selecting the electromagnetic wave absorption/photoelectric conversion site of silicon in the depth direction, the color separation is remarkably improved. In the case where the organic layer is made of two layers, the function as the electromagnetic wave absorption/photoelectric conversion site of silicon may be brought for only one color, and preferred color separation can be achieved.

The inorganic layer preferably has a structure in which plural photodiodes are superposed for every pixel in a depth direction within the semiconductor substrate and a color signal corresponding to a signal charge as generated in each of the photodiodes by light as absorbed in the plural photodiodes is read out into the external. It is preferable that the plural photodiodes contain a first photodiode as provided in the depth for absorbing B light and at least one second photodiode as provided in the depth for absorbing R light and are provided with a color signal read-out circuit for reading out a color signal corresponding to the foregoing signal charge as generated in each of the foregoing plural photodiodes. According to this construction, it is possible to carry out color separation without using a color filter. Furthermore, according to circumstances, since light of a negative sensitive component can also be detected, it becomes possible to realize color imaging with good color reproducibility. Moreover, in the invention, it is preferable that a junction part of the foregoing first photodiode is formed in a depth of up to about 0.2 µm from the semiconductor substrate surface and that a junction part of the foregoing second photodiode is formed in a depth of up to about 2 µm from the semiconductor substrate surface.

The inorganic layer will be hereunder described in more detail. Preferred examples of the construction of the inorganic layer include a photoconductive type, a p-n junction type, a shotkey junction type, a PIN junction type, a light receiving device of MSM (metal-semiconductor-metal) type, and a light receiving device of phototransistor type. In the invention, it is preferred to use a light receiving device in which a plural number of a first conducting type region and a second conducting type region which is a reversed conducting type to the first conducting type are alternately stacked within a single semiconductor substrate and each of the junction planes of the first conducting type and second conducting type regions is formed in a depth suitable for subjecting mainly plural lights of a different wavelength region to photoelectric conversion The single semiconductor substrate is preferably mono-crystalline silicon, and the color separation can be carried out by utilizing absorption wavelength characteristics relying upon the depth direction of the silicon substrate.

As the inorganic semiconductor, InGaN based, InAlN based, InAlP based, or InGaAlP based inorganic semiconductors can also be used. The InGaN based inorganic semiconductor is an inorganic semiconductor as adjusted so as to have a maximum absorption value within a blue wavelength range by properly changing the In-containing composition. That is, the composition becomes $In_xGa_{1-x}N$ (0<x<1).

Such a compound semiconductor is produced by employing a metal organic chemical vapor deposition method (MOCVD method). With respect to the InAlN based nitride semiconductor using, as a raw material, Al of the Group 13 similar to Ga, it can be used as a short wavelength light receiving part similar to the InGaN based semiconductor. Furthermore, InAlP or InGaAlP lattice-matching with a GaAs substrate can also be used.

The inorganic semiconductor may be of a buried structure. The "buried structure" as referred to herein refers to a construction in which the both ends of a short wavelength light receiving part are covered by a semiconductor different from the short wavelength light receiving part. The semiconductor for covering the both ends is preferably a semiconductor having a band gap wavelength shorter than or equal to a hand gap wavelength of the short wavelength light receiving part.

The organic layer and the inorganic layer may be bound to each other in any form. Furthermore, for the purpose of electrically insulating the organic layer and the inorganic layer from each other, it is preferred to provide an insulating layer therebetween.

With respect to the junction, npn junction or pnpn junction from the light incident side is preferable. In particular, the pnpn junction is more preferable because by providing a p layer on the surface and increasing a potential of the surface, it is possible to trap a hole as generated in the vicinity of the surface and a dark current and reduce the dark current.

In such a photodiode, when an n-type layer, a p-type layer, an n-type layer and a p-type layer which are successively diffused from the p-type silicon substrate surface are deeply formed in this order, the pn-junction diode is formed of four layers of pnpn in a depth direction of silicon. With respect to the light which has come into the diode from the surface side, the longer the wavelength, the deeper the light penetration is. Also, the incident wavelength and the attenuation coefficient are inherent to silicon. Accordingly, the photodiode is designed such that the depth of the pn junction plane covers respective wavelength bands of visible light. Similarly, a junction diode of three layers of npn is obtained by forming an n-type layer, a p-type layer and n-type layer in this order. Here, a light signal is extracted from the n-type layer, and the p-type layer is connected to a ground wire.

Furthermore, when an extraction electrode is provided in each region and a prescribed reset potential is applied, each region is depleted, and the capacity of each junction part becomes small unlimitedly. In this way, it is possible to make the capacity as generated on the junction plane extremely small.

(Auxiliary Layer)

In the invention, it is preferred to provide an ultraviolet light absorption layer and/or an infrared light absorption layer as an uppermost layer of the electromagnetic wave absorption/photoelectric conversion site. The ultraviolet light absorption layer is able to at least absorb or reflect light of not more than 400 nm and preferably has an absorptance of 50% or more in a wavelength region of not more than 400 nm. The infrared light absorption layer is able to at least absorb or reflect light of 700 nm or more and preferably has an absorptance of 50% or more in a wavelength region of 700 nm or more.

Such an ultraviolet light absorption layer or infrared light absorption layer can be formed by a conventionally known method. For example, there is known a method in which a mordant layer made of a hydrophilic high molecular substance such as gelatin, casein, glue, and polyvinyl alcohol is provided on a substrate and a dye having a desired absorption wavelength is added to or dyes the mordant layer to form a colored layer. In addition, there is known a method of using a colored resin resulting from dispersing a certain kind of coloring material in a transparent resin. For example, it is possible to use a colored resin layer resulting from mixing a coloring material in a polyamino based resin as described in JP-A-58-46325, JP-A-60-78401, JP-A-60-184202, JP-A-60-184203, JP-A-60-184204, and JP-A-60-184205. A coloring agent using a polyamide resin having photosensitivity can also be used.

It is also possible to disperse a coloring material in an aromatic polyamide resin containing a photosensitive group in the molecule thereof and capable of obtaining a cured layer at not higher than 200° C. as described in JP-B-7-113685 and to use a colored resin having a pigment dispersed therein as described in JP-B-7-69486.

In the invention, a dielectric multiple layer is preferably used. The dielectric multiple layer has sharp wavelength dependency of light transmission and is preferably used.

It is preferable that the respective electromagnetic wave absorption/photoelectric conversion sites are separated by an insulating layer. The insulating layer can be formed by using a transparent insulating material such as glass, polyethylene, polyethylene terephthalate, polyethersulfone, and polypropylene. Silicon nitride, silicon oxide, and the like are also preferably used. Silicon nitride prepared by film formation by plasma CVD is preferably used in the invention because it is high in compactness and good in transparency.

For the purpose of preventing contact with oxygen, moisture, etc., a protective layer or a sealing layer can be provided, too.

Examples of the protective layer include a diamond thin layer, an inorganic material layer made of a metal oxide, a metal nitride, etc., a high molecular layer made of a fluorine resin, poly-p-xylene, polyethylene, a silicone resin, a polystyrene resin, etc., and a layer made of a photocurable resin. Furthermore, it is also possible to cover a device portion by glass, a gas-impermeable plastic, a metal, etc. and package the device itself by a suitable sealing resin. In this case, it is also possible to make a substance having high water absorption properties present in a packaging.

In addition, light collecting efficiency can be improved by forming a microlens array in the upper part of a light receiving device, and therefore, such an embodiment is preferable, too.

(Charge Accumulation/Transfer/Read-out Site)

As to the charge accumulation/transfer/read-out site, JP-A-58-103166, JP-A-58-103165, JP-A-2003-332551, and so on can be made hereof by reference. A construction in which an MOS transistor is formed on a semiconductor substrate for every pixel unit or a construction having CCD as a device can be properly employed. For example, in the case of a photoelectric conversion device using an MOS transistor, a charge is generated in a photoelectric conversion layer by incident light which has transmitted through electrodes; the charge runs to the electrodes within the photoelectric conversion layer by an electric field as generated between the electrodes by applying voltage to the electrodes; and the charge is further transferred to a charge accumulating part of the MOS transistor and accumulated in the charge accumulating part. The charge as accumulated in the charge accumulating part is transferred to a charge read-out part by switching of the MOS transistor and further outputted as an electric signal. In this way, full-color image signals are inputted in a solid imaging device including a signal processing part.

The signal charge can be read out by injecting a fixed amount of bias charge into the accumulation diode (refresh mode) and then accumulating a fixed amount of the charge (photoelectric conversion mode). The light receiving device itself can be used as the accumulation diode, or an accumulation diode can be separately provided.

The read-out of the signal will be hereunder described in more detail. The read-out of the signal can be carried out by using a usual color read-out circuit. A signal charge or a signal current which is subjected to light/electric conversion in the light receiving part is accumulated in the light receiving part itself or a capacitor as provided. The accumulated charge is subjected to selection of a pixel position and read-out by a measure of an MOS type imaging device (so-called CMOS sensor) using an X-Y address system. Besides, as an address selection system, there is enumerated a system in which every pixel is successively selected by a multiplexer switch and a digital shift register and read out as a signal voltage (or charge) on a common output line. An imaging device of a two-dimensionally arrayed X-Y address operation is known as a CMOS sensor. In this imaging device, a switch as provided in a pixel connected to an X-Y intersection point is connected to a vertical shift register, and when the switch is turned on by a voltage from the vertical scanning shift register, signals as read out from pixels as provided in the same line is read out on the output line in a column direction. The signals are successively read out from an output end through the switch to be driven by a horizontal scanning shift register.

For reading out the output signals, a floating diffusion detector or a floating gate detector can be used. Furthermore, it is possible to seek improvements of S/N by a measure such as provision of a signal amplification circuit in the pixel portion and correlate double sampling.

For the signal processing, gamma correction by an ADC circuit, digitalization by an AD transducer, luminance signal processing, and color signal processing can be applied. Examples of the color signal processing include white balance processing, color separation processing, and color matrix processing. In using for an NTSC signal, an RGB signal can be subjected to conversion processing of a YIQ signal.

The charge transfer/read-out site must have a mobility of charge of 100 $cm^2$/vol·sec or more. This mobility can be obtained by selecting the material among semiconductors of the IV group, the III-V group or the II-VI group. Above all, silicon semiconductors (also referred to as "Si semiconductor") are preferable because of advancement of microstructure refinement technology and low costs. As to the charge transfer/charge read-out system, there are made a number of proposals, and all of them are employable. Above all, a COMS type device or a CCD type device is an especially preferred system. In addition, in the case of the invention, in many occasions, the CMOS type device is preferable in view of high-speed read-out, pixel addition, partial read-out and consumed electricity.

(Connection)

Though plural contact sites for connecting the electromagnetic wave absorption/photoelectric conversion side to the charge transfer/read-out site may be connected by any metal, a metal selected among copper, aluminum, silver, gold, chromium and tungsten is preferable, and copper is especially preferable. In response to the plural electromagnetic wave absorption/photoelectric conversion sites, each of the contact sites must be placed between the electromagnetic wave absorption/photoelectric conversion site and the charge transfer/read-out site. In the case of employing a stacked structure of plural photosensitive units of blue, green and red lights, a blue light extraction electrode and the charge transfer/read-out site, a green light extraction electrode and the charge transfer/read-out site, and a red light extraction electrode and the charge transfer/read-out site must be connected, respectively.

(Process)

The stacked photoelectric conversion device according to the invention can be produced according to a so-called known microfabrication process which is employed in manufacturing integrated circuits and the like. Basically, this process is concerned with a repeated operation of pattern exposure with active light, electron beams, etc. (for example, i- or g-bright line of mercury, excimer laser, X-rays, and electron beams), pattern formation by development and/or burning, alignment of device forming materials (for example, coating, vapor deposition, sputtering, and CV), and removal of the materials in a non-pattern area (for example, heat treatment and dissolution treatment).

(Utility)

A chip size of the device can be selected among a brownie size, a 135 size, an APS size, a 1/1.8-inch size, and a smaller size. A pixel size of the stacked photoelectric conversion device according to the invention is expressed by a circle-corresponding diameter which is corresponding to a maximum area in the plural electromagnetic absorption/photoelectric conversion sites. Though the pixel size is not limited, it is preferably from 2 to 20 microns, more preferably from 2 to 10 microns, and especially preferably from 3 to 8 microns.

When the pixel size exceeds 20 microns, a resolving power is lowered, whereas when the pixel size is smaller than 2 microns, the resolving power is also lowered due to radio interference between the sizes.

The stacked photoelectric conversion device according to the invention can be utilized for a digital still camera. Also, it is preferable that the photoelectric conversion device according to the invention is used for a TV camera. Besides, the photoelectric conversion device according to the invention can be utilized for a digital video camera, a monitor camera (in, for example, office buildings, parking lots, unmanned loan-application systems in financial institution, shopping centers, convenience stores, outlet malls, department stores, pachinko parlors, karaoke boxes, game centers, and hospitals), other various sensors (for example, TV door intercoms, individual authentication sensors, sensors for factory automation, robots for household use, industrial robots, and piping examination systems), medical sensors (for example, endoscopes and fundus cameras), videoconference systems, television telephones, camera-equipped mobile phones, automobile safety running systems (for example, back guide monitors, collision prediction systems, and lane-keeping systems), and sensors for video game.

Above all, the photoelectric conversion device according to the invention is suitable for use of a television camera. The reason for this resides in the matter that since it does not require a color decomposition optical system, it is able to achieve miniaturization and weight reduction of the television camera. Furthermore, since the photoelectric conversion device according to the invention has high sensitivity and high resolving power, it is especially preferable for a television camera for high-definition broadcast. In this case, the term "television camera for high-definition broadcast" as referred to herein includes a camera for digital high-definition broadcast.

In addition, the photoelectric conversion device according to the invention is preferable because an optical low pass filter can be omitted and higher sensitivity and higher resolving power can be expected.

In addition, in the photoelectric conversion device according to the invention, not only the thickness can be made thin, but also a color decomposition optical system is not required. Therefore, with respect to shooting scenes in which a different sensitivity is required, such as "circumstances with a different brightness such as daytime and nighttime" and "immobile subject and mobile subject" and other shooting scenes in which requirements for spectral sensitivity or color reproducibility differ, various needs for shooting can be satisfied by a single camera by exchanging the photoelectric conversion device according to the invention and performing shooting. At the same time, it is not required to carry plural cameras. Thus, a load of a person who wishes to take a shot is reduced. As a photoelectric conversion device which is subjective to the exchange, in addition to the foregoing, exchangeable photoelectric conversion devices for purposes of infrared light shooting, black-and-white shooting, and change of a dynamic range can be prepared.

The TV camera according to the invention can be prepared by referring to a description in Chapter 2 of *Design Technologies of Television Camera*, edited by the Institute of Image Information and Television Engineers (Aug. 20, 1999, published by Corona Publishing Co., Ltd., ISBN 4-339-00714-5) and, for example, replacing a color decomposition optical system and an imaging device as a basic construction of a television camera as shown in FIG. 2.1 thereof by the photoelectric conversion device according to the invention.

By aligning the foregoing stacked light receiving device, it can be utilized not only as an imaging device but also as an optical sensor such as biosensors and chemical sensors or a color light receiving device in a single body.

(Preferred Photoelectric Conversion Device According to the Invention)

A preferred photoelectric conversion device according to the invention will be hereunder described with reference to FIG. 2. A numeral 13 is a silicon mono-crystal substrate and serves as both an electromagnetic wave absorption/photoelectric conversion site of B light and R light and a charge accumulation of charge as generated by photoelectric conversion/transfer/and read-out site. Usually, a p-type silicon substrate is used. Numerals 21, 22 and 23 represent an n layer, a p layer and an n layer, respectively as provided in the silicon substrate. The n layer 21 is an accumulation part of a signal charge of R light and accumulates a signal charge of R light which has been subjected to photoelectric conversion by pn junction. The accumulated charge is connected to a signal read-out pad 27 by a metal wiring 19 via a transistor 26. The n layer 23 is an accumulation part of a signal charge of B light and accumulates a signal charge of B light which has been subjected to photoelectric conversion by pn junction. The accumulated charge is connected to the signal read-out pad 27 by the metal wiring 19 via a transistor similar to the transistor 26. Here, though the p layer, the n layer, the transistor, the metal wiring, and the like are schematically shown, each of them is properly selected among optimum structures and so on as described previously in detail. Since the B light and the R light are divided depending upon the depth of the silicon substrate, it is important to select the depth of the pn junction, etc. from the silicon. substrate, the dope concentration and so on. A numeral 12 is a layer containing a metal wiring and is a layer containing, as a major component, silicon oxide, silicon nitride, etc. It is preferable that the thickness of the layer 12 is thin as far as possible. The thickness of the layer 12 is not more than 5 μm, preferably not more than 3 μm, and further preferably not more than 2 μm. A numeral 11 is also a layer containing, as a major component, silicon oxide, silicon nitride, etc. The layers 11 and 12 are each provided with a plug for sending a signal charge of G light to the silicon substrate. The plugs are connected to each other between the layers 11 and 12 by a pad 16. As the plug, one containing, as a major component, tungsten is preferably used. As the pad, one containing, as a major component, aluminum is preferably used. It is preferable that a barrier layer including the foregoing metal wiring is provided. The signal charge of G light which is sent via plugs 15 is accumulated in a layer 25 in the silicon substrate. The n layer 25 is separated by a p layer 24. The accumulated charge is connected to the signal read-out pad 27 by the metal wiring 19 via the transistor similar to the transistor 26. Since the photoelectric conversion by the pn junction by the layers 24 and 25 becomes a noise, a light shielding layer 17 is provided in the layer 11. As the light shielding layer, one containing, as a major component, tungsten, aluminum, etc. is usually used. It is preferable that the thickness of the layer 12 is thin as far as possible. The thickness of the layer 12 is not more than 3 μm, preferably not more than 2 μm, and further preferably not more than 1 μm. It is preferable that the signal read-out pad 27 is provided for every signal of the B, G and R signals. The foregoing process can be achieved by a conventionally known process, a so-called CMOS process.

The electromagnetic wave absorption/photoelectric conversion site of G light is shown by numerals 6, 7, 8, 9, 10 and 14. The numerals 6 and 14 are each a transparent electrode and are corresponding to a counter electrode and a pixel electrode, respectively; Though the pixel electrode 14 is a transparent electrode, for the purpose of enhancing the electric connection with the plug 15, in many cases, a site made of aluminum, molybdenum, etc. is required in the connecting part. These transparent electrodes are biased through a wiring from a connection electrode 18 and a counter electrode pad 20. A structure in which an electron can be accumulated in the layer 25 by positively biasing the pixel electrode 14 against the transparent counter electrode 6 is preferable. In this case, the numeral 7 is an electron blocking layer; the numeral 8 is a p layer; the numeral 9 is an n layer; and the numeral 10 is a hole blocking layer. Here, a representative layer construction of the organic layer was shown. The thickness of the organic layer made of the layers 7, 8, 9 and 10 is preferably not more than 0.5 μm more preferably not more than 0.4 μm, and especially preferably not more than 0.3 μm in total. A thickness of each of the transparent counter electrode 6 and the transparent pixel electrode 14 is especially preferably not more than 0.2 μm. Numerals 3, 4 and 5 are each a protective layer containing, as a major component, silicon nitride, etc. By these protective layers, it becomes easy to achieve a manufacturing process of layers containing the organic layer. In particular, these layers are able to reduce damages against the organic layer at the time of resist pattern preparation and etching during the preparation of the connection electrode 18 and the like. Furthermore, in order to avoid the resist pattern preparation, the etching and the like, it is also possible to achieve the production using a mask. So far as the foregoing conditions are met, the thickness of each of the protective layers 3, 4 and 5 is preferably not more than 0.5 μm. The numeral 3 is a protective layer of the connection electrode 18. A numeral 2 is an infrared light-cut dielectric multiple layer. A numeral 1 is an antireflection layer. A total thickness of the layers 1, 2 and 3 is preferably not more than 1 μm.

The photoelectric conversion device as described previously by FIG. 2 is constructed of one pixel for each of the B pixel and the R pixel vs. four pixels for the G pixel. The photoelectric conversion device may be constructed of one pixel for each of the B pixel and the R pixel vs. one pixel for the G pixel; may be constructed of one pixel for each of the B pixel and the R pixel vs. three pixel for the G pixel; and may be constructed of one pixel for each of the B pixel and the R pixel vs. two pixels for the G pixel. In addition, the photoelectric conversion device may be constructed of an arbitrary combination. While preferred embodiments of the invention have been described, it should not be construed that the invention is limited thereto.

EXAMPLES

Examples and Embodiments of the invention will be hereunder described, but it should not be construed that the invention is limited thereto.

Example 1

A rinsed ITO substrate was placed in a vapor deposition device and subjected to vapor deposition with Compound (5) of the invention as an n-type organic semiconductor in a thickness of 50 nm. The following Compound (A) as a p-type organic dye was subsequently subjected to vapor deposition in a thickness of 100 nm thereon, thereby preparing an organic pn stack type photoelectric conversion layer. Next, a patterned mask (with a light receiving area of 2 mm×2 mm) was placed on the organic thin layer and subjected to vapor deposition with aluminum in a thickness of 100 nm within the vapor deposition device, and a drying agent was subsequently charged, thereby sealing the device. There was thus prepared a photoelectric conversion device (Device 1).

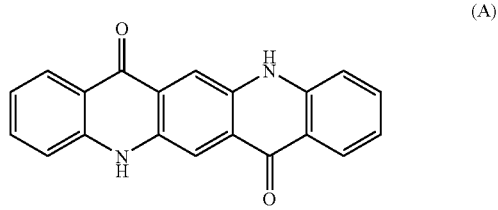

(A)

Comparative Example

A device (Device 2) was prepared in exactly the same manner as in Example 1, except for not using the Compound (5) of the invention.

Next, the respective devices were evaluated in the following manners.

With respect to each of the devices, a characteristic was evaluated when a bias of 10 V was applied to the device while making the ITO side plus and making the aluminum electrode side minus.

Using a solar module evaluation system manufactured by Optel, the wavelength dependency of external quantum yield and the electric field intensity dependency of optical current and dark current were evaluated.

In Device 2 of the Comparative Example, the dark current was very large, and its S/N ratio was substantially 0. On the other hand, in Device 1 of Example 1, the dark current was reduced by stacking Compound (5), and its S/N ratio was 10.

Example 2

By using the device of Example 1 according to the invention in the G layer as shown in FIG. 1, it is possible to prepare a color imaging device exhibiting excellent color separation.

By using the photoelectric conversion site of Example 1 which is capable of absorbing G light in the portions 8 and 9 of the photoelectric conversion site as shown in FIG. 2, it is possible to prepare a color imaging device exhibiting excellent color separation.

This application is based on Japanese Patent application JP 2005-240964, filed Aug. 23, 2005, the entire content of which is hereby incorporated by reference, the same as if set forth at length.

What is claimed is:

1. A photoelectric conversion layer comprising a compound represented by the following formula (1):

Formula (1)

wherein L represents a divalent or polyvalent connecting group; n represents an integer of 2 or more; and A is a chemical structure represented by the following formula (2):

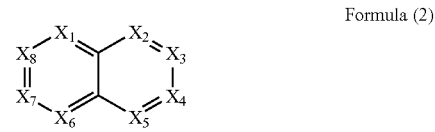

Formula (2)

wherein $X_1$ to $X_8$ each independently represents a substituted or unsubstituted carbon atom or a nitrogen atom.

2. The photoelectric conversion layer according to claim 1, wherein the photoelectric conversion layer includes a p-type semiconductor layer and an n-type semiconductor layer, and contains the compound represented by the formula (1).

3. The photoelectric conversion layer according to claim 1, wherein the photoelectric conversion layer includes a p-type semiconductor layer and an n-type semiconductor layer, and at least one of the p-type semiconductor layer and the n-type semiconductor layer contains the compound represented by the formula (1).

4. The photoelectric conversion layer according to claim 2, which further includes a bulk heterojunction structure layer provided between the p-type semiconductor layer and the n-type semiconductor layer, the bulk heterojunction structure layer containing a p-type semiconductor and an n-type semiconductor.

5. The photoelectric conversion layer according to claim 2, which has a structure having a number of a repeating structure of a pn junction layer formed of the p-type semiconductor layer and the n-type semiconductor layer of 2 or more.

6. The photoelectric conversion layer according to claim 2, wherein the p-type semiconductor is an organic semiconductor, and the n-type semiconductor is an organic semiconductor.

7. The photoelectric conversion layer according to claim 1, wherein the photoelectric conversion layer has a thickness of from 30 to 300 nm.

8. The photoelectric conversion layer according to claim 2, wherein the p-type semiconductor or the n-type semiconductor is colorless.

9. A photoelectric conversion device comprising the photoelectric conversion layer according to claim 1.

10. A photoelectric conversion device comprising a pair of electrodes and the photoelectric conversion layer according to claim 1 between the pair of electrodes.

11. A photoelectric conversion device comprising two or more photoelectric conversion layers, wherein at least one of the photoelectric conversion layers is the photoelectric conversion layer according to claim 1.

12. The photoelectric conversion device according to claim 11, wherein the two or more photoelectric conversion layers are three layers of a blue photoelectric conversion layer, a green photoelectric conversion layer and a red photoelectric conversion layer.

13. The photoelectric conversion device according to claim 12, wherein spectral absorption maximum values of the blue photoelectric conversion layer, the green photoelectric conversion layer and the red photoelectric conversion layer are in a range of from 400 nm to 500 nm, in a range of from 500 nm to 600 nm, and in a range of from 600 nm to 700 nm, respectively.

14. The photoelectric conversion device according to claim 12, wherein spectral sensitivity maximum values of the blue photoelectric conversion layer, the green photoelectric conversion layer and the red photoelectric conversion layer are in a range of from 400 nm to 500 nm, in a range of from 500 nm to 600 nm, and in a range of from 600 nm to 700 nm, respectively.

15. The photoelectric conversion device according to claim 12, wherein a gap between a shortest wavelength and a longest wavelength exhibiting 50% of the spectral maximum absorption of each of the blue photoelectric conversion layer, the green photo-electric conversion layer and the red photoelectric conversion layer is not more than 120 nm.

16. The photoelectric conversion device according to claim 12, wherein a gap between a shortest wavelength and a longest wavelength exhibiting 50% of the spectral maximum sensitivity of each of the blue photoelectric conversion layer, the green photo-electric conversion layer and the red photoelectric conversion layer is not more than 120 nm.

17. The photoelectric conversion device according to claim 12, wherein a gap between a shortest wavelength and a longest wavelength exhibiting 80% of the spectral maximum absorption of each of the blue photoelectric conversion layer, the green photo-electric conversion layer and the red photoelectric conversion layer is from 20 nm to 100 nm.

18. The photoelectric conversion device according to claim 12, wherein a gap between a shortest wavelength and a longest wavelength exhibiting 80% of the spectral maximum sensitivity of each of the blue photoelectric conversion layer, the green photo-electric conversion layer and the red photoelectric conversion layer is from 20 nm to 100 nm.

19. The photoelectric conversion device according to claim 12, wherein a gap between a shortest wavelength and a longest wavelength exhibiting 20% of the spectral maximum absorption of each of the blue photoelectric conversion layer, the green photo-electric conversion layer and the red photoelectric conversion layer is not more than 180 nm.

20. The photoelectric conversion device according to claim 12, wherein a gap between a shortest wavelength and a longest wavelength exhibiting 20% of the spectral maximum sensitivity of each of the blue photoelectric conversion layer, the green photo-electric conversion layer and the red photoelectric conversion layer is not more than 180 nm.

21. The photoelectric conversion device according to claim 12, wherein a longest wavelength exhibiting 50% of the spectral maximum absorption of the blue photoelectric conversion layer, the green photoelectric conversion layer and the red photoelectric conversion layer is from 460 nm to 510 nm, from 560 nm to 610 nm and from 640 nm to 730 nm, respectively.

22. The photoelectric conversion device according to claim 12, wherein a longest wavelength exhibiting 50% of the spectral maximum sensitivity of the blue photoelectric conversion layer, the green photoelectric conversion layer and the red photoelectric conversion layer is from 460 nm to 510 nm, from 560 nm to 610 nm and from 640 nm to 730 nm, respectively.

23. A photoelectric conversion device including at least two electromagnetic wave absorption/photoelectric conversion sites, at least one of the sites comprising the photoelectric conversion layer according to claim 1.

24. The photoelectric conversion device according to claim 23, wherein the at least two electromagnetic wave absorption/photoelectric conversion sites have a stack type structure of at least two layers.

25. The photoelectric conversion device according to claim 24, wherein an upper layer of the photoelectric conversion device comprises a site capable of absorbing green light and undergoing photoelectric conversion.

26. A photoelectric conversion device including at least three electromagnetic wave absorption/photoelectric conversion sites, at least one of the sites comprising the photoelectric conversion layer according to claim 1.

27. The photoelectric conversion device according to claim 26, wherein an upper layer of the photoelectric conversion device comprises a site capable of absorbing green light and undergoing photoelectric conversion.

28. The photoelectric conversion device according to claim 26, wherein at least two of the electromagnetic wave absorption/photoelectric conversion sites comprise an inorganic layer.

29. The photoelectric conversion device according to claim 28, wherein at least two of the electromagnetic wave absorption/photoelectric conversion sites are provided within a silicon substrate.

30. An imaging device comprising the photoelectric conversion device according to claim 1.

31. A method for applying an electric field of from $10^{-2}$ V/cm to $1\times10^{10}$ V/cm to the photoelectric conversion layer according to claim 1.

* * * * *